(12) United States Patent
Furuhata et al.

(10) Patent No.: US 8,766,515 B2
(45) Date of Patent: Jul. 1, 2014

(54) FLEXURAL VIBRATING REED, FLEXURAL VIBRATOR, AND PIEZOELECTRIC DEVICE

(75) Inventors: Makoto Furuhata, Matsumoto (JP); Takeo Funakawa, Chino (JP); Takashi Yamazaki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 608 days.

(21) Appl. No.: 13/125,000

(22) PCT Filed: Oct. 22, 2009

(86) PCT No.: PCT/JP2009/005542
§ 371 (c)(1),
(2), (4) Date: Apr. 19, 2011

(87) PCT Pub. No.: WO2010/047115
PCT Pub. Date: Apr. 29, 2010

(65) Prior Publication Data
US 2011/0198969 A1 Aug. 18, 2011

(30) Foreign Application Priority Data
Oct. 24, 2008 (JP) .................................. 2008-273975

(51) Int. Cl.
*H03H 9/21* (2006.01)

(52) U.S. Cl.
CPC ........................................ *H03H 9/21* (2013.01)
USPC ........................................................ 310/370

(58) Field of Classification Search
CPC ........ H03H 9/1021; H03H 9/19; H03H 9/215
USPC ........................................................ 310/370
See application file for complete search history.

(56) References Cited

U.S. PATENT DOCUMENTS

| 6,911,765 B2 | 6/2005 | Kawashima |
| 7,932,664 B2 * | 4/2011 | Yamazaki et al. ............ 310/370 |

(Continued)

FOREIGN PATENT DOCUMENTS

| EP | 1 575 166 A1 | 9/2005 |
| JP | U-2-32229 | 2/1990 |

(Continued)

OTHER PUBLICATIONS

Itoh, H. et al., "Analysis of Q-value of a quartz-crystal tuning fork using thermoelastic equations," *The 36th EM Symposium*, May 17-18, 2007, pp. 5-8 (with translation).

(Continued)

*Primary Examiner* — J. San Martin
(74) *Attorney, Agent, or Firm* — Oliff PLC

(57) ABSTRACT

Deterioration of the Q value caused by the thermoelastic effect is suppressed. Since a first depth of a first groove and a second depth of a second groove are smaller than a distance between a surface including a third surface and a surface including a fourth surface, the first and second grooves do not penetrate between the surface including the third surface and the surface including the fourth surface. In addition, the sum of the first depth of the first groove and the second depth of the second groove is greater than the distance between the third and fourth surfaces, a heat transfer path between a first expandable portion (the first surface) and a second expandable portion (the second surface) cannot be formed as a straight line. As such, the heat transfer path between the first expandable portion (the first surface) and a second expandable portion (the second surface) is made to detour to the first and second grooves and and thus be lengthened.

11 Claims, 17 Drawing Sheets

(56) References Cited

U.S. PATENT DOCUMENTS

| | | | |
|---|---|---|---|
| 7,936,115 B2 * | 5/2011 | Kikushima | 310/370 |
| 7,944,132 B2 * | 5/2011 | Furuhata et al. | 310/370 |
| 8,053,958 B2 * | 11/2011 | Kikushima | 310/370 |
| 8,102,103 B2 * | 1/2012 | Furuhata et al. | 310/370 |
| 8,294,337 B2 * | 10/2012 | Kawai et al. | 310/370 |
| 8,432,087 B2 * | 4/2013 | Yamada et al. | 310/370 |
| 2003/0080652 A1 | 5/2003 | Kawashima | |
| 2008/0238557 A1 * | 10/2008 | Kizaki | 331/68 |
| 2012/0007685 A1 * | 1/2012 | Yamada | 331/156 |
| 2013/0241364 A1 * | 9/2013 | Yamada | 310/370 |

FOREIGN PATENT DOCUMENTS

| | | |
|---|---|---|
| JP | A-6-112760 | 4/1994 |
| JP | A-2002-204141 | 7/2002 |
| JP | A-2004-200917 | 7/2004 |
| JP | A-2004-260249 | 9/2004 |
| JP | A-2005-5963 | 1/2005 |
| JP | A-2005-151423 | 6/2005 |
| JP | A-2007-243995 | 9/2007 |
| JP | A-2007-329879 | 12/2007 |
| JP | A-2008-11348 | 1/2008 |
| JP | A-2008-178022 | 7/2008 |
| WO | WO 00/44092 A1 | 7/2000 |

OTHER PUBLICATIONS

Roszhart, T. et al., "The Effect of Thermoelastic Internal Friction on the Q of Micromachined Silicon Resonators," *Solid-State Sensor and Actuator Workshop*, Jun. 4-7, 1990, pp. 13-16, 1990 $4^{th}$ Technical Digest, IEEE.

International Search Report issued in International Application No. PCT/JP2009/005542 on Nov. 24, 2009 (with translation).

* cited by examiner

FLEXURAL VIBRATING REED, FLEXURAL VIBRATOR, AND PIEZOELECTRIC DEVICE

TECHNICAL FIELD

The present invention relates to a flexural vibrating reed, a flexural vibrator, and a piezoelectric device.

BACKGROUND ART

Typically, it is known that as a flexural vibrating reed is reduced in size, the Q value is reduced, and thus flexural vibration is impeded. This is due to the thermoelastic effect that occurs as relaxation oscillation that is in inverse proportion to the relaxation time for temperature equilibrium by transfer of heat and a vibration frequency of the flexural vibrating reed become closer. As flexural vibration occurs in the flexural vibrating reed, elastic deformation occurs, and thus the temperature of a contracting surface is increased and the temperature of an expanding surface is reduced, resulting in a temperature difference inside the flexural vibrating reed. The flexural vibration is impeded by the relaxation oscillation that is in inverse proportion to the relaxation time for the temperature equilibrium from the temperature difference by thermal conduction (heat transfer), so that the Q value is reduced. In another opinion, energy lost due to thermal conduction cannot be used as the flexural vibration energy, resulting in a reduction in the Q value of the flexural vibrating reed.

Therefore, a groove or a through-hole is provided in a rectangular cross-section of the flexural vibrating reed to impede the heat transfer from the contracting surface to the expanding surface of the vibrator, thereby suppressing fluctuation of the Q value caused by the thermoelastic effect (for example, refer to Patent Literature 1).

In addition, in Non-Patent Literature 1, the Q value of an example of the structure of a tuning fork-type crystal vibrator is calculated by a thermoelastic equation. From the calculation result, it is reported that about 95% of the CI (Crystal Impedance) at 25° C. is caused by the thermoelastic effect.

Citation List

Patent Document

[PTL 1] JP-UM-A-2-32229 (pages 4 to 5, FIGS. 1 to 3)
Non-Patent Literature
[NPL 1] The $36^{th}$ EM Symposium, pages 5 to 8, "Analysis of Q-value of Quartz Crystal Tuning Fork by Use of Thermoelastic Coupling Equation" by Hideaki ITOH and Yuhya TAMAKI

SUMMARY OF INVENTION

Technical Problem

However, even though the techniques according the related art described above are used, when the through-hole is provided in a flexural vibrating portion, the rigidity of the flexural vibration portion is significantly degraded. In addition, even though the groove is provided in the flexural vibrating portion as disclosed in Patent Literature 1, the effect of preventing the reduction in the Q value caused by the thermoelastic effect is insufficient. Therefore, in order to prevent the reduction in the Q value caused by the thermoelastic effect, there is still room for further improvement, which is set as an object of the invention.

Solution to Problem

The invention is made to solve at least a part of the above-described problem, and may be implemented as the following embodiment or applications.

[Application 1] A flexural vibrating reed according to this application, includes: a base; and a flexural vibrating portion which is formed to extend from the base and in which flexural vibration occurs, wherein the flexural vibrating portion includes first, second, third, and fourth surfaces which alternately expand and contract due to the flexural vibration and includes a first groove provided in the third surface and a second groove provided in the fourth surface, a surface including the first surface and a surface including the second surface are mutually opposed, a surface including the third surface and a surface including the fourth surface are mutually opposed, a first depth of the first groove and a second depth of the second groove are smaller than a distance between the surface including the third surface and the surface including the fourth surface, the sum of the first depth and the second depth are greater than the distance, and the first and second grooves are interposed between the surface including the first surface and the surface including the second surface.

[Application 2] A flexural vibrating reed according to this application includes: a base; and a vibrating portion extending from the base, wherein the vibrating portion includes first and second principal surfaces which are mutually opposed, a first groove provided in the first principal surface, and a second groove provided in the second principal surface, the first and second grooves are arranged in a direction orthogonal to the extension direction in a plan view from a normal direction of the first principal surface, a first depth of the first groove and a second depth of the second groove are smaller than a distance in the normal direction between the first and second principal surfaces, and the sum of the first and second depths is greater than the distance.

[Application 3] In the flexural vibrating reed according to the above applications, the vibrating portion has the third and fourth principal surfaces which connect the first and second principal surfaces to each other and are mutually opposed, and the third and fourth principal surfaces have a relationship in which in a case where the third principal surface expands due to flexural vibration of the vibrating portion, the fourth principal surface contracts, and in a case where the third principal surface contracts, the fourth principal surface expands.

According to Applications 1 to 3, since the first depth of the first groove and the second depth of the second groove are smaller than the distance between the surface including the third surface and the surface including the fourth surface, the first and second grooves do not penetrate between the surface including the third surface and the surface including the fourth surface. Therefore, compared to a case where a through-hole is provided in a flexural vibrating portion, rigidity of the flexural vibrating portion can be improved. In addition, since the sum of the first depth of the first groove and the second depth of the second groove are greater than the distance, a heat transfer path between a first expandable portion (the first surface) and a second expandable portion (the second surface) cannot be formed as a straight line. As such, the heat transfer path between the first expandable portion (the first surface) and the second expandable portion (the second surface) can be made to detour to the first and second grooves and thus be lengthened. Therefore, a relaxation time for temperature equilibrium by thermal conduction (heat transfer) is lengthened, so that a relaxation vibration frequency which is in inverse proportion to the relaxation time becomes distant from a flexural vibration frequency. Accordingly, fluctuation of the Q value caused by the thermoelastic effect is suppressed, thereby realizing a reduction in the size of the flexural vibrating reed.

[Application 4] In the flexural vibrating reed according to the above applications, it is preferable that the first and second grooves be disposed to intersect a geodesic line establishing a shortest distance between the surface including the first surface and the surface including the second surface.

Accordingly, since the first and second grooves are disposed to intersect the geodesic line establishing the shortest distance between the surface including the first surface and the surface including the second surface, the heat transfer path between the first and second surfaces can be made to detour to the first and second grooves and thus be longer than the shortest distance between the surface including the first surface and the surface including the second surface. Therefore, fluctuation of the Q value caused by the thermoelastic effect is suppressed, thereby realizing a reduction in the size of the flexural vibrating reed.

[Application 5] In the flexural vibrating reed according to the applications, it is preferable that the first and second grooves be formed from the flexural vibrating portion to the base.

Accordingly, since the first and second grooves are formed from the flexural vibrating portion to the base and thus are disposed at the base, the heat transfer path even in the base can be lengthened. Therefore, the relaxation time for temperature equilibrium by the thermal conduction (heat transfer) is lengthened, so that the relaxation vibration frequency which is in inverse proportion to the relaxation time becomes distant from a flexural vibration frequency. Accordingly, fluctuation f the Q value caused by the thermoelastic effect is suppressed, thereby realizing a reduction in the size of the flexural vibrating reed.

[Application 6] In the flexural vibrating reed according to the above applications, it is preferable that, assuming that a flexural vibration frequency of the vibrating portion is f, the Pi is $\pi$, a thermal conductivity in the vibrating direction of a material used for the vibrating portion is k, a mass density of the material used for the vibrating portion is $\rho$, a thermal capacity of the material used for the vibrating portion is $C_p$, and a width in the vibrating direction of the vibrating portion is a, $0.09<f/fm$ is satisfied when $fm=\pi k/(2\rho C_p a^2)$. More preferably, $0.25<f/fm$ is satisfied, and further preferably, $1<f/fm$ is satisfied.

Accordingly, the relaxation vibration frequency becomes sufficiently distant from the flexural vibration frequency, so that a reduction in the Q value due to the thermoelastic effect is suppressed, thereby realizing a reduction in the size of the flexural vibrating reed.

[Application 7] In the flexural vibrating reed according to the above applications, it is preferable that the first and second grooves be disposed on the base side from a half of the length in the extension direction of the flexural vibrating portion from the base.

Accordingly, since the first and second grooves are disposed on the base side from the half of the length in the extension direction of the flexural vibrating portion from the base, where transfer of heat relatively significantly occurs due to the flexural vibration, the effects described above can be exhibited. In addition, mechanical strength of a part over the half of the length in the extension direction of the flexural vibrating portion from the base, where transfer of heat due to the flexural vibration relatively insignificantly occurs, can be ensured.

[Application 8] A flexural vibrator according to this application, includes: the flexural vibrating reed described above; and a package that accommodates the flexural vibrating reed, wherein the flexural vibrating reed is airtightly sealed in the package.

Accordingly, the flexural vibrator can exhibit the effects as described above.

[Application 9] A piezoelectric device according to this application includes: the flexural vibrating reed described above; an IC chip that drives the flexural vibrator; and a package that accommodates the flexural vibrating reed and the IC chip, wherein the flexural vibrating reed and the IC chip are airtightly sealed in the package.

Accordingly, the piezoelectric device can exhibit the effects as described above.

DESCRIPTION OF EMBODIMENTS

In the following embodiments, a crystal vibrating reed made from a crystal which is a kind of piezoelectric element is exemplified as a flexural vibrating reed. In addition, as a piezoelectric vibrator and a piezoelectric device using the crystal vibrating reed, a crystal vibrator and a crystal oscillator are exemplified respectively. In addition, for the illustration and description, X, Y, and Z axes are represented for the description, and the axes which are the crystal axes of a crystal are shown so that the electrical axis is on the crystal X axis, the mechanical axis is on the crystal Y axis, and the optical axis is on the crystal Z axis. In addition, the Z axis shown is tilted at 1 to 5 degrees with respect to the crystal Z axis, and the Z-X plane may be formed to be tilted along the tilt.

First Embodiment

Hereinafter, a first embodiment will be described with reference to FIGS. 1 to 4.

Figure 1:
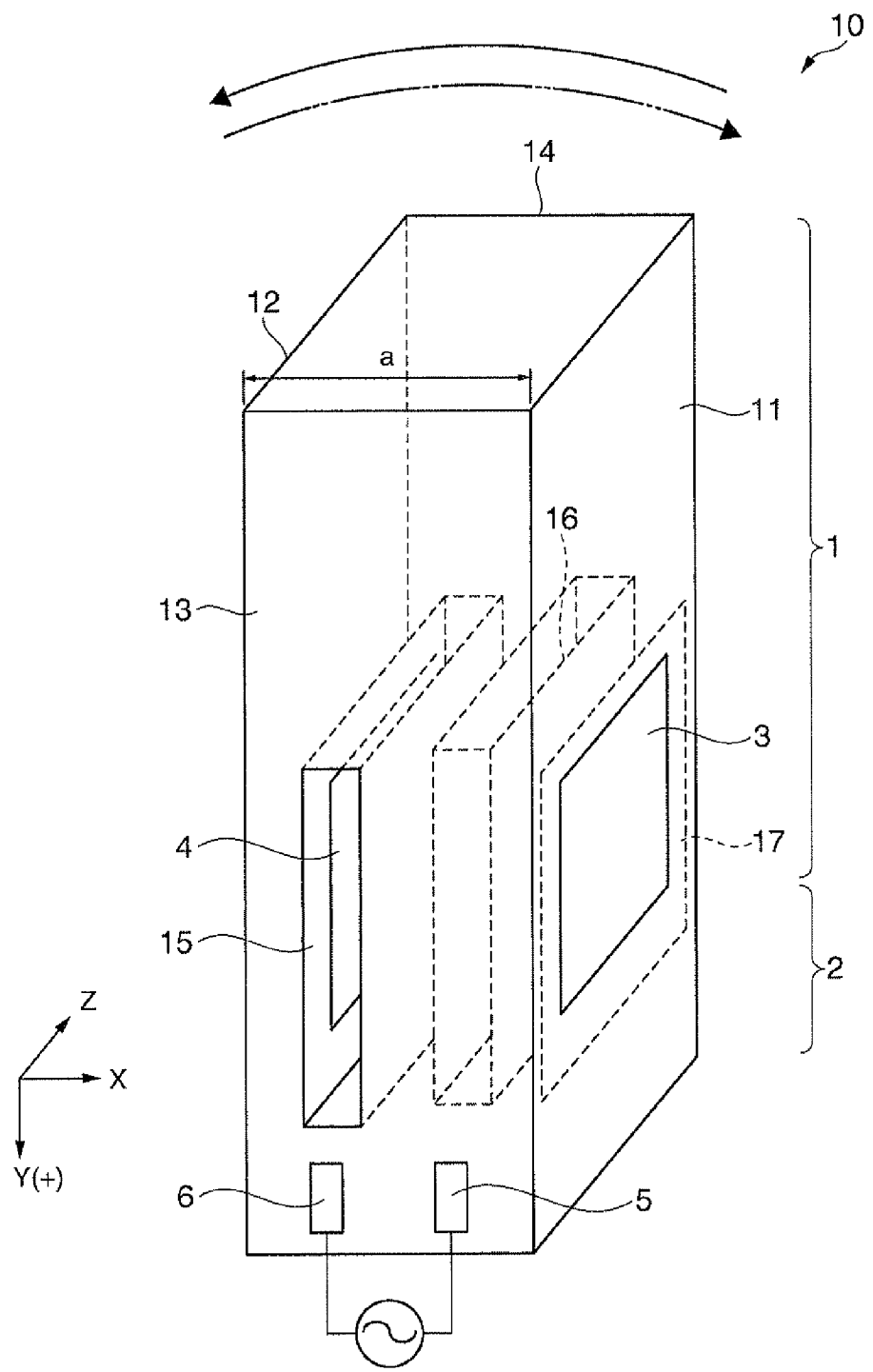
FIG. 1 is a schematic perspective view illustrating a crystal vibrating reed according to a first embodiment.
Figure 2:
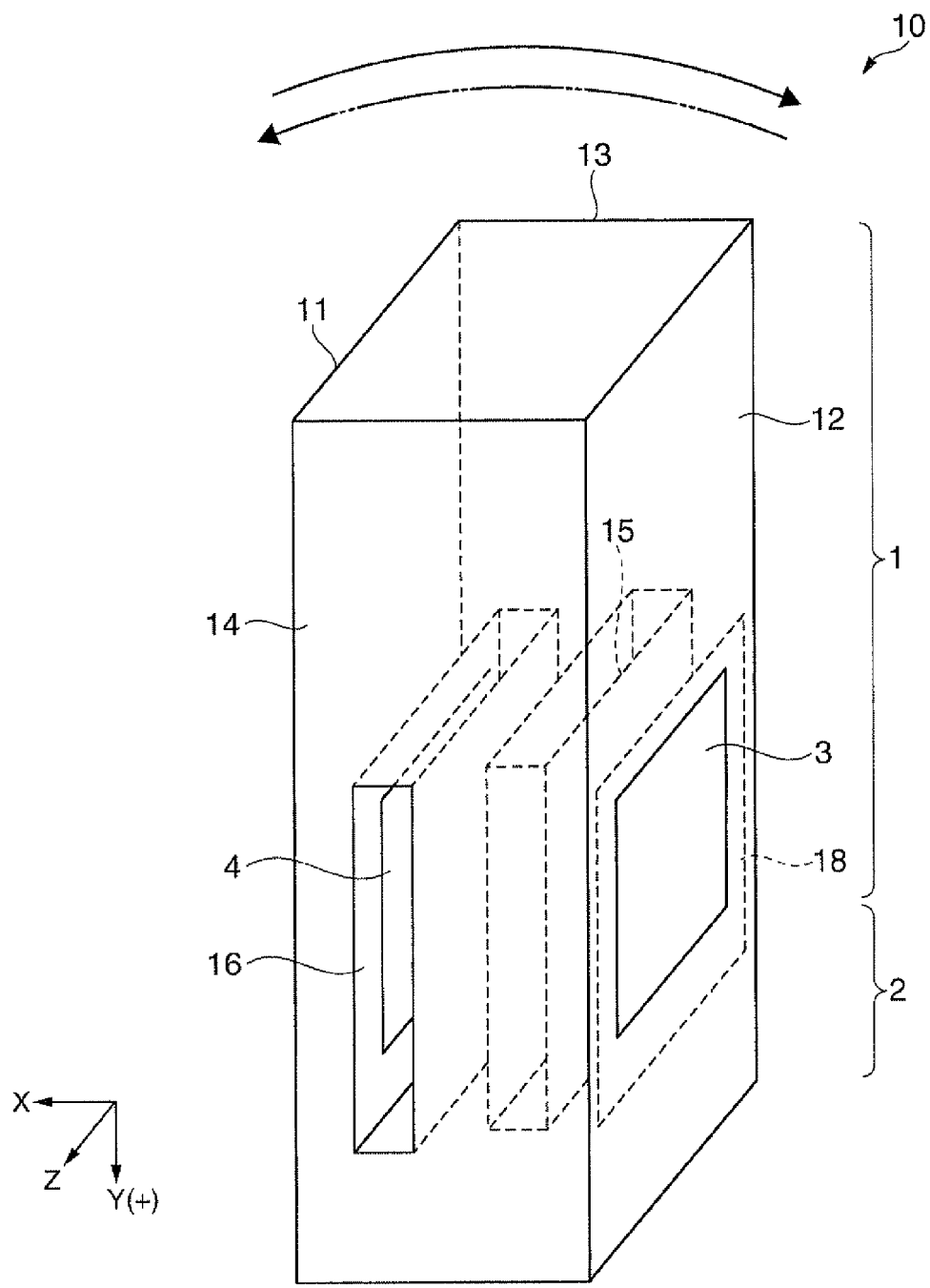
FIG. 2 is a schematic perspective view illustrating the crystal vibrating reed illustrated in FIG. 1 as seen from a direction rotated by 180° about the Y axis.

FIG. 1 is a schematic perspective view illustrating a crystal vibrating reed 10 according to the first embodiment. FIG. 2 is a schematic perspective view illustrating the crystal vibrating reed 10 illustrated in FIG. 1 as seen from a direction rotated by 180° about the Y axis. FIG. 3 is a Z-X schematic cross-sectional view as seen from the Y(+) direction of FIGS. 1 and 2 and is a schematic wiring diagram. FIG. 4 is a graph showing Q dependency of flexural vibrating reeds (crystal vibrating reed) on f/fm and is a graph showing a comparison in cross-sectional shapes of flexural vibrating portions.

As illustrated in FIGS. 1 and 2, the crystal vibrating reed 10 includes a flexural vibrating portion 1 which is a vibrating portion, a base 2, excitation electrodes 3 and 4, and fixed electrodes 5 and 6. The crystal vibrating reed 10 includes a first surface 11 which is a third principal surface, a second surface 12 which is a fourth principal surface, a third surface 13 which is a first principal surface, and a fourth surface 14 which is a second principal surface. The first and second surfaces 11 and 12 which are third and fourth principal surfaces, respectively, are disposed to be mutually opposed, and the third and fourth surfaces 13 and 14 which are first and second principal surfaces are disposed to be mutually opposed. The third surface 13 is provided with a first groove 15. The fourth surface 14 is provided with a second groove 16. In addition, the first groove 15 is disposed to oppose the second surface 12, and the second groove 16 is disposed to oppose the first surface 11. In addition, in a plan view from the normal direction of the third surface 13 which is the first principal surface, the first and second grooves 15 and 16 are arranged in a direction orthogonal to the extension direction of the flexural vibrating portion 1 from the base 2.

In addition, in the specification, the first and second principal surfaces do not include inner surfaces and bottom surfaces of the first and second grooves.

The first and second grooves 15 and 16 are formed from the flexural vibrating portion 1 to the base 2, and one ends of the first and second grooves 15 and 16 are disposed at the base 2. The other ends of the first and second grooves 15 and 16 are disposed on the base side from the half of the length in the extension direction (in the reverse direction of the Y(+) direction illustrated) of the flexural vibrating portion 1 from the base 2.

Here, the first and second grooves 15 and 16 are formed at a boundary between the flexural vibrating portion 1 and the base 2 at which there is a high degree of contraction and expansion of the flexural vibrating portion 1 that occurs due to flexural vibration, that is, are formed from the flexural vibrating portion 1 to the base 2. However, the invention is not limited thereto, and for example, they may be provided in the flexural vibrating portion 1 and may not be provided in the base 2. In addition, the first and second grooves 15 and 16 are disposed on the base side from the half of the length in the extension direction (in the reverse direction of the Y(+) direction illustrated) of the flexural vibrating portion 1 from the base 2, the invention is not limited thereto, and they may be formed to the length in the extension direction, of the flexural vibrating portion 1 (the end in the extension direction).

The flexural vibrating portion 1 and base 2 are formed by performing wet-etching or the like on those cut from crystal ore. The excitation electrodes 3 and 4 and the fixed electrodes 5 and 6 each include an underlayer made of chrome (Cr), nickel (Ni), or the like and an electrode layer formed on the underlayer and made of gold (Au), silver (Ag), or the like. The underlayers and the electrode layers are formed by deposition, sputtering, or the like. The first and second grooves 15 and 16 are formed by performing wet-etching on the third and fourth surfaces 13 and 14.

The first surface 11 includes a first expandable portion 17 which alternately contracts and expands in the Y direction due to the flexural vibration indicated by the solid arrow and the double-dot-dashed arrow. The second surface 12 includes a second expandable portion 18 which alternately contracts and expands in the Y direction due to the flexural vibration indicated by the solid arrow and the double-dot-dashed arrow.

When contraction occurs in the first expandable portion 17 (the first surface 11), expansion occurs in the second expandable portion 18 (the second surface 12) and the first groove 15. In addition, contraction occurs in the second groove 16. Conversely, when expansion occurs in the first expandable portion 17 (the first surface 11), contraction occurs in the second expandable portion 18 (the second surface 12) and the first groove 15. In addition, expansion occurs in the second groove 16. As such, the first and second surfaces 11 and 12 which are disposed to be mutually opposed alternately expand and contract due to the flexural vibration. In addition, the temperature of the contracting surface increases, and the temperature of the expanding surface decreases, so that a temperature difference occurs between the first and second surfaces 11 and 12, that is, in the flexural vibrating reed. Relaxation vibration occurs at a relaxation vibration frequency fo which is in inverse proportion to a relaxation time τ for temperature equilibrium from the temperature difference by thermal conduction (heat transfer). Here, the relaxation vibration frequency fo and the relaxation time τ are shown as fo=1/(2πτ). In addition, in the specification, the symbol "/" represents division.

In general, it is known that a relaxation vibration frequency fm is obtained by the following expression:

$$fm = \pi k/(2\rho C_p a^2) \quad (1)$$

where π is the Pi, k is a thermal conductivity in the vibrating direction (the flexural vibrating direction) of the vibrating portion (flexural vibrating portion), ρ is a mass density of the vibrating portion, $C_p$ is a thermal capacity of the vibrating portion (flexural vibrating portion), and a is a width in the vibrating direction (the flexural vibrating direction) of the vibrating portion (flexural vibrating portion).

The relaxation vibration frequency fm obtained when coefficients of the material of the vibrating portion itself are input to the thermal conductivity k, the mass density ρ, and the thermal capacity $C_p$ of Expression (1), is a relaxation vibration frequency of the flexural vibrating portion in a case where the first and second grooves 15 and 16 are not provided in the vibrating portion.

The excitation electrodes 3 are formed at the first and second expandable portions 17 and 18. In addition, the excitation electrodes 4 are formed at the first and second grooves 15 and 16.

The fixed electrodes 5 and 6 are disposed at the base 2. Wiring is provided between the fixed electrodes and 6 so that an alternating current flows therebetween. The fixed electrode 5 is connected to the excitation electrode 3, and the fixed electrode 6 is connected to the excitation electrode 4 (not shown).

Figure 3A:
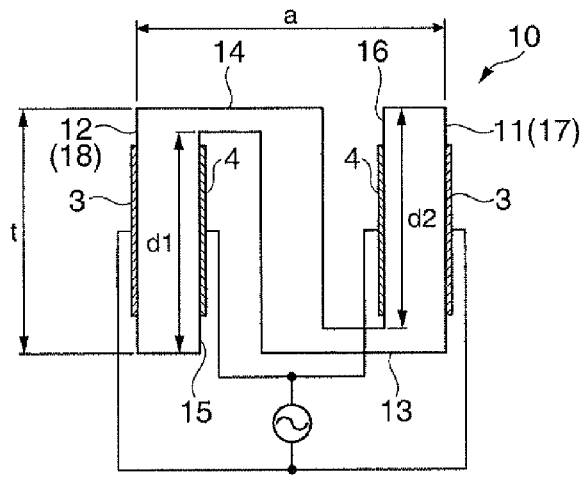
FIG. 3 is a Z-X schematic cross-sectional view as seen from the Y(+) direction of FIGS. 1 and 2, and is a schematic wiring diagram.
Figure 4:
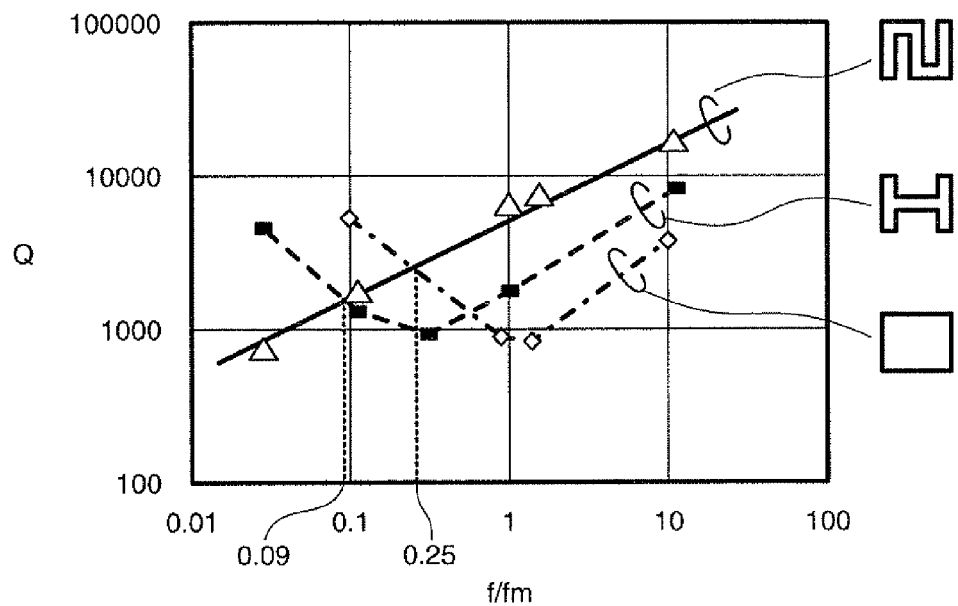
FIG. 4 is a graph showing Q dependency of various flexural vibrating reeds on f/fm and is a graph showing a comparison in cross-sectional shapes of flexural vibrating portions.

As illustrated in FIG. 3(a), the excitation electrodes 3 are each disposed at the first expandable portion 17 of the first surface 11 and at the second expandable portion 18 of the second surface 12, and the excitation electrodes 4 are each disposed at the first and second grooves 15 and 16.

A first depth d1 of the first groove 15 and a second depth d2 of the second groove 16 are shorter than a distance t between the third and fourth surfaces 13 and of the flexural vibrating portion 1. That is, the first and second grooves 15 and 16 do not penetrate between the third and fourth surfaces 13 and 14. For example, in FIG. 3(a), both the first depth d1 of the first groove 15 and the second depth d2 of the second groove 16 are 0.9t. Here, as long as the first depth d1 and the second depth d2 are smaller than the distance t and the sum of the first depth d1 and the second depth d2 are greater than the distance t, they are not limited to 0.9t, and for example, may have a combination of d1=0.9t and d2=0.4t, or any combination such as d1=0.6t and d2=0.8t. As the first depth d1 and the second depth d2 are smaller than the distance t, the first and second grooves 15 and 16 are not through-holes, so that rigidity of the flexural vibrating portion 1 can be enhanced compared to a case where the groove is configured as a through-hole.

As such, in the first and second surfaces 11 and 12 which alternately expand and contract due to the flexural vibration, a heat transfer path for temperature equilibrium from the temperature difference between the first and second surfaces 11 and 12 by the thermal conduction (heat transfer) is made to detour to the first and second grooves 15 and 16 and thus becomes longer than a straight-line distance between the first and second surfaces 11 and 12. Accordingly, the relaxation time τ for temperature equilibrium by the thermal conduction (heat transfer) is lengthened, so that the relaxation vibration frequency fo which is in inverse proportion to the relaxation time τ becomes distant from a flexural vibration frequency f.

FIG. 4 is a graph showing Q dependency of the flexural vibrating reed (crystal vibrating reed) on f/fm. Here, fm is a relaxation flexural vibration frequency in a case where a flexural vibrating portion is not provided with grooves (in a case where the cross-sectional shape of a flexural vibrating portion is substantially rectangular), and has the same definition through other embodiments. Figures shown on the right of the graph of FIG. 4 schematically illustrate cross-sectional shapes of the flexural vibrating portion.

In FIG. 4, triangular markers represent a case of the cross-sectional shape of FIG. 3(a), black rectangular markers represent so-called an H-shape case where first and second principal surfaces of the flexural vibrating portion are provided with grooves and thus the cross-sectional shape of the flexural vibrating portion is "H", and outlined rhombic markers represents a plot of so-called a flat-plate case where no principal surfaces of the flexural vibrating portion are provided with grooves. In addition, the thick solid line is an approximation straight line of values of the triangular markers, the broken line is an interpolation straight line between the rectangular markers, and a dot-dashed line is an interpolation straight line between the rhombic markers.

It becomes apparent from FIG. 4 that as the cross-sectional shape of the flexural vibrating portion 1 is as illustrated in FIG. 3(a) and f/fm has a value grater than 0.09, the flexural vibrating reed having a higher Q value than that of the H-shape case is realized. By setting f/fm to a value higher than 0.25, the flexural vibrating reed having a higher Q value than either of the H-shape and flat-plate cases can be realized. When f/fm is made greater than 1, a higher Q value than either of the H-shape and the flat-plate cases can be achieved.

As described above, the fixed electrode 5 is connected to the excitation electrode 3, and the fixed electrode 6 is connected to the excitation electrode 4. Therefore, as illustrated in FIG. 3(a), an alternating current flows between the excitation electrodes 3 and 4. Accordingly, an electric field occurs in the flexural vibrating portion 1 interposed between the excitation electrodes 3 and 4. As the alternating current flows between the excitation electrodes 3 and 4, a positive charge and a negative charge alternately occurs, and thus the direction of the electric field changes. In response to the direction of the generated electric field, expansion and contraction occurs in the first surface 11 (the first expandable portion 17), the second groove 16, the second surface 12 (the second expandable portion 18), and the first groove 15 due to the piezoelectric effect in the Y direction illustrated. As such, flexural vibration indicated by the solid arrow and the double-dot-dashed arrow occurs in the flexural vibrating portion 1 at the flexural vibration frequency f.

According to the flexural vibration, even in the base 2 which is in contact with the first and second surfaces 11 and 12 and the first and second grooves 15 and 16, similar to the first and second expandable portions 17 and 18, expansion and contraction occurs in the Y direction illustrated.

In addition, the fixed electrodes 5 and 6 are also used for fixing the crystal vibrating reed 10 to a package (not shown) or the like for accommodation thereof.

Modified Example

Figure 3B:
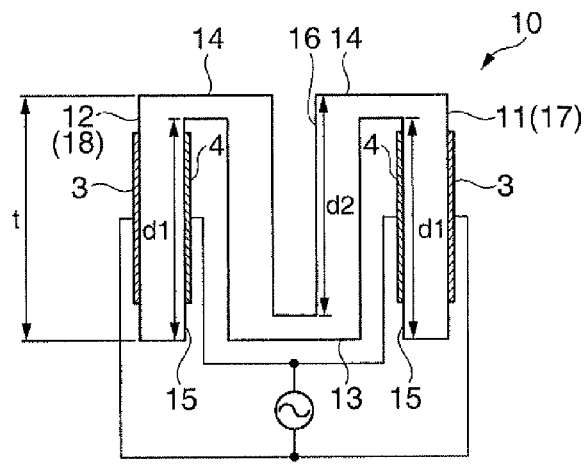
Figure 3C:
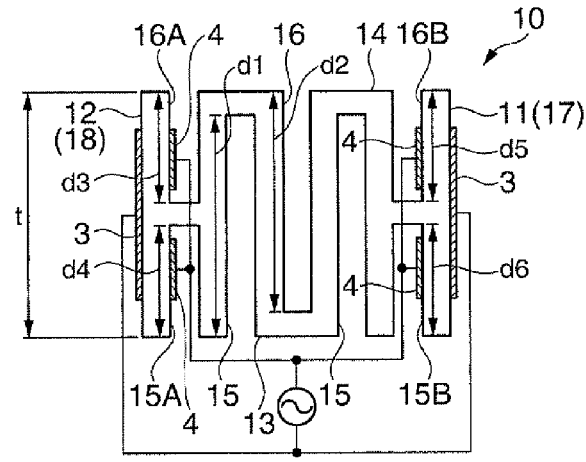

FIGS. 3(b) and 3(c) are diagrams illustrating modified examples of the first embodiment related to the first and second grooves 15 and 16 illustrated in FIG. 3(a). Here, arrangement and wiring of the excitation electrodes 3 and 4 illustrated in FIGS. 3(b) and 3(c) are the same as the arrangement and the wiring of the excitation electrodes 3 and 4 illustrated in FIG. 3(a).

The crystal vibrating reed 10 illustrated in FIG. 3(b) is different from the crystal vibrating reed 10 illustrated in FIG. 3(a) in that two first grooves 15 are provided in the third surface 13 and the excitation electrode 4 is included in each of the two first grooves 15.

The crystal vibrating reed 10 illustrated in FIG. 3(c) is different from the crystal vibrating reed 10 illustrated in FIG. 3(b) in that the third surface 13 is provided with a first groove 15A having a depth d4 and a first groove 15B having a depth d6, and the fourth surface 14 is provided with a second groove 16A having a depth d3 and a second groove 16B having a depth d5. Here, the sum of the depths d3 and d4 are, similarly to the first depth d1, smaller than the distance t between the third and fourth surfaces 13 and 14 of the flexural vibrating portion 1. Similarly, the sum of the depths d5 and d6 are smaller than the distance t, similarly to the second depth d2.

As such, in the first and second surfaces 11 and 12 which alternately expand and contract due to the flexural vibration, the heat transfer path for temperature equilibrium from the temperature difference between the first and second surfaces 11 and 12 by the thermal conduction (heat transfer) is made to detour to the first and second grooves 15 and 16 and thus becomes longer than a straight-line distance between the first and second surfaces 11 and 12. Accordingly, the relaxation time τ for temperature equilibrium by the thermal conduction (heat transfer) is lengthened, so that the relaxation vibration frequency fo which is in inverse proportion to the relaxation time τ becomes distant from a flexural vibration frequency f. In addition, it is preferable that a value f/fm obtained by dividing the flexural vibration frequency f by the relaxation vibration frequency fm exceed 0.09, which suppresses a reduction in the Q value due to the thermoelastic effect. More preferably, 0.25<f/fm is satisfied, and further preferably, 1<f/fm is satisfied. Accordingly, further improvement of the Q value is achieved.

Therefore, according to the first embodiment and the modified examples thereof, since the first depth d1 of the first groove 15 and the second depth d2 of the second groove 16 are smaller than the distance between the third and fourth surfaces 13 and 14, the first and second grooves 15 and 16 do not penetrate between the third and fourth surfaces 13 and 14. In addition, since the sum of the first depth d1 of the first groove 15 and the second depth d2 of the second groove 16 is greater than the distance t between the third and fourth surfaces 13 and 14, the heat transfer path between the first expandable portion 17 (the first surface 11) and the second expandable portion 18 (the second surface 12) cannot be formed as a straight line. As such, the heat transfer path between the first expandable portion 17 (the first surface 11) and the second expandable portion 18 (the second surface 12) can be made to detour to the first and second grooves 15 and 16 and thus be lengthened. Therefore, the relaxation time τ for temperature equilibrium by the thermal conduction (heat transfer) is lengthened, so that the relaxation vibration frequency fo which is in inverse proportion to the relaxation time τ becomes distant from a flexural vibration frequency f. Accordingly, fluctuation of the Q value caused by the thermoelastic effect is suppressed, thereby realizing a reduction in the size of the flexural vibrating reed 10.

Accordingly, since the first and second grooves 15 and 16 are disposed to intersect the geodesic line establishing the shortest distance between the first surface 11 and the second surface 12, the heat transfer path between the first and second surfaces 11 and 12 can be made to detour to the first and second grooves 15 and 16 and thus be longer than the shortest distance between the first surface 11 and the second surface 12. Therefore, fluctuation of the Q value caused by the thermoelastic effect is suppressed, thereby realizing a reduction in the size of the flexural vibrating reed 10.

Accordingly, since the first and second grooves 15 and 16 are formed from the flexural vibrating portion 1 to the base 2 and thus disposed at the base 2, the heat transfer path even in the base 2 can be lengthened. The relaxation time τ for temperature equilibrium by the thermal conduction (heat transfer) is lengthened, so that the relaxation vibration frequency fo which is in inverse proportion to the relaxation time τ becomes distant from a flexural vibration frequency f. Accordingly, therefore, fluctuation of the Q value caused by the thermoelastic effect is suppressed, thereby realizing a reduction in the size of the flexural vibrating reed 10.

Accordingly, since the first and second grooves 15 and 16 are disposed on the base side from the half of the length in the extension direction of the flexural vibrating portion 1 from the base 2, where transfer of heat relatively significantly occurs due to the flexural vibration, the effects described above can be exhibited. In addition, mechanical strength of a part over the half of the length in the extension direction of the flexural vibrating portion 1 from the base 2, where transfer of heat due to the flexural vibration relatively insignificantly occurs, can be ensured.

Accordingly, the relaxation vibration frequency becomes sufficiently distant from the flexural vibration frequency, so that a reduction in the Q value due to the thermoelastic effect is suppressed, thereby realizing a reduction in the size of the flexural vibrating reed. Particularly, compared to the case of a flexural vibrating reed without the first or second groove 15 or provided therein, or the case where the sum of the first depth d1 of the first groove 15 and the second depth d2 of the second groove 16 is between the third and fourth surfaces 13 and 14 or is smaller than the distance t between the third and fourth surfaces 13 and 14, so-called a flexural vibrating reed having an H-shaped cross-section, a reduction in the size of the flexural vibrating reed in which a reduction in the Q value due to the thermoelastic effect is suppressed can be realized.

Second Embodiment

Hereinafter, a second embodiment will be described with reference to FIGS. 5 to 7.

Figure 5:
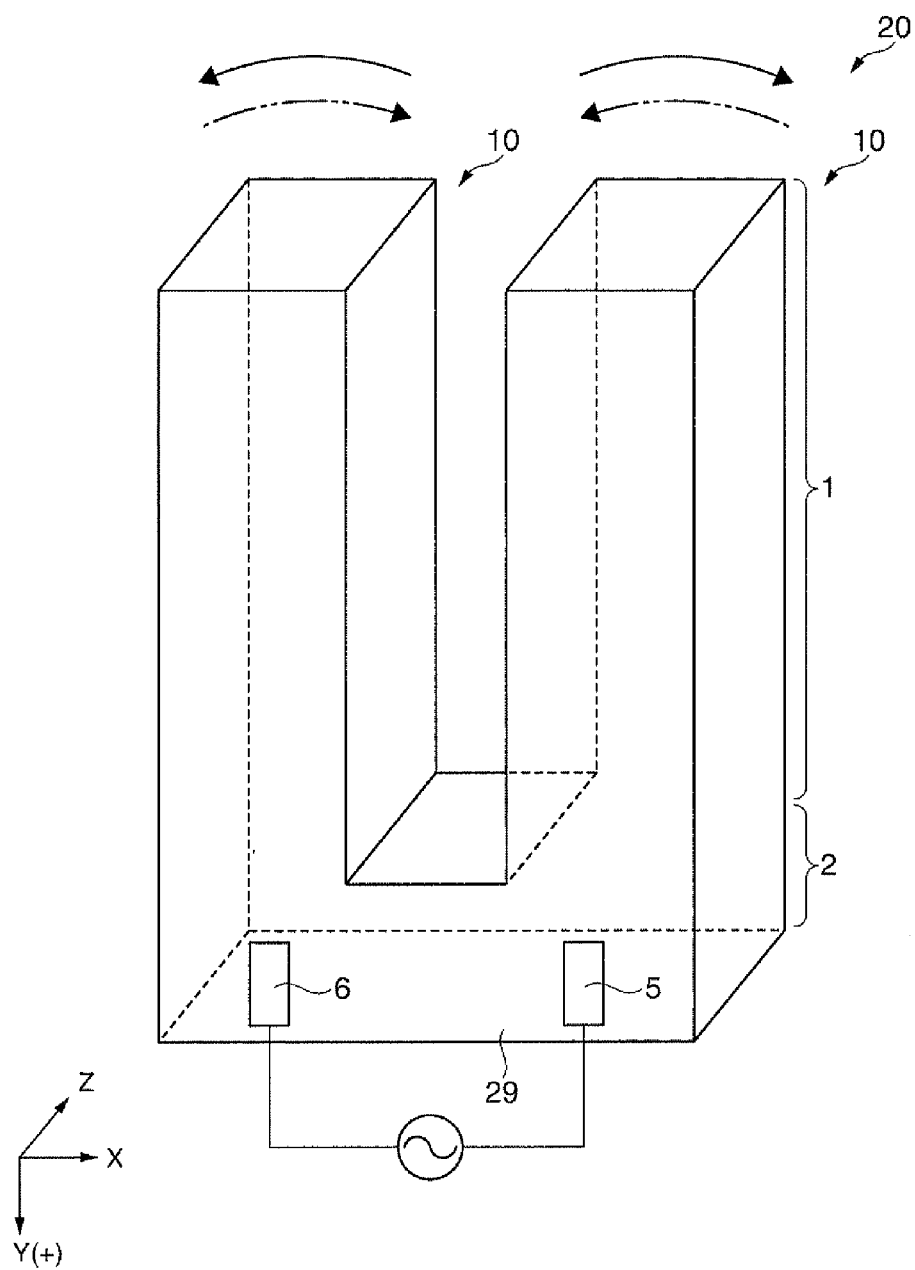
FIG. 5 is a schematic perspective view illustrating a crystal vibrating reed according to a second embodiment.

FIG. 5 is a schematic perspective view illustrating a crystal vibrating reed 20 according to a second embodiment. FIGS. 6 and 7 are Z-X schematic cross-sectional views as seen from the Y(+) direction of FIG. 5, and are schematic wiring diagrams.

The crystal vibrating reed 20 illustrated in FIG. 5 includes two crystal vibrating reeds 10 of the first embodiment illustrated in FIGS. 1 and 2. Accordingly, like elements are denoted by like reference numerals, and description of the configuration will be omitted. Here, the shapes and arrangement illustrated in FIG. 3(a) are exemplified for the description of the flexural vibrating portion 1 which is the vibrating portion, the excitation electrodes 3 and 4, and the base 2.

As illustrated in FIG. 5, the crystal vibrating reed 20 includes two crystal vibrating reeds 10 each including the flexural vibrating portion 1 which is the vibrating portion and the base 2. The two bases 2 are joined by a connection portion 29.

Figure 6A:
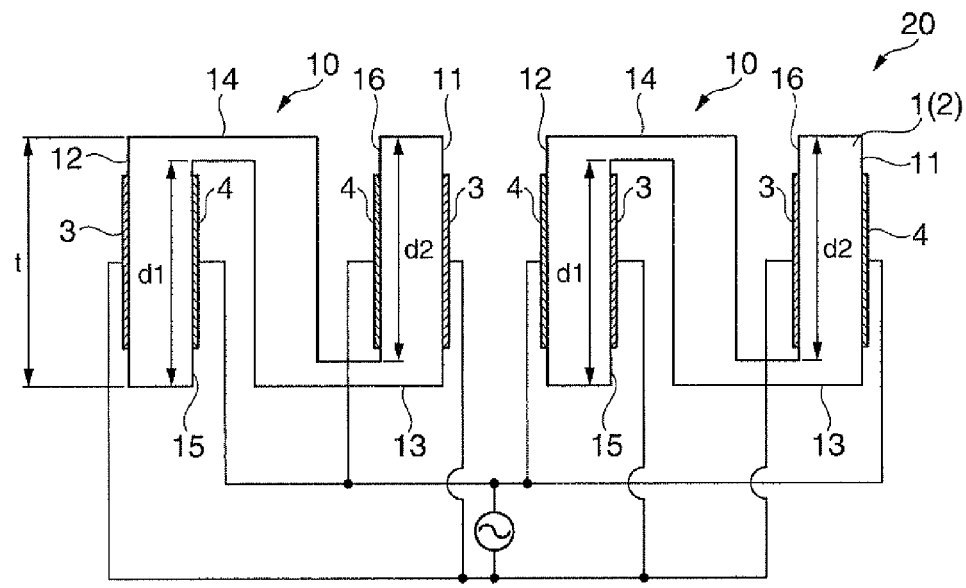
FIG. 6 is a Z-X schematic cross-sectional view as seen from the Y(+) direction of FIG. 5, and is a schematic wiring diagram.

As illustrated in FIG. 6(a), the flexural vibrating portion 1 and the base 2 are formed as illustrated in FIG. 3(a). In addition, the two flexural vibrating portions 1 and the bases 2 also have the same arrangement. From among the two flexural vibrating portions 1, the arrangement of the excitation electrodes 3 and 4 of the one flexural vibrating portion 1 illustrated on the left in FIG. 6(a) is the same as that of FIG. 3(a). On the other hand, the arrangement of the excitation electrodes 3 and 4 of the other flexural vibrating portion 1 illustrated on the right in FIG. 6(a) is different from that of FIG. 3(a) and has the inverted arrangement. That is, in the other flexural vibrating portion 1 illustrated on the right, the excitation electrodes 4 are provided in the first and second expandable portions 17 and 18. In addition, the excitation electrodes 3 are provided in the first and second grooves 15 and 16.

In addition, an alternating current flows between the excitation electrodes 3 and 4. Accordingly, in the flexural vibrating portion 1 of the crystal vibrating reed 20, as illustrated in FIG. 5, flexural vibration indicated by the solid arrow and the double-dot-dashed arrow occurs.

As such, in the first and second surfaces 11 and 12 which alternately expand and contract due to the flexural vibration, the heat transfer path for temperature equilibrium from the temperature difference between the first and second surfaces 11 and 12 by the thermal conduction (heat transfer) is made to detour to the first and second grooves 15 and 16 and thus becomes longer than the straight-line distance between the first and second surfaces 11 and 12. Accordingly, the relaxation time τ for temperature equilibrium by the thermal conduction (heat transfer) is lengthened, so that the relaxation vibration frequency fo which is in inverse proportion to the relaxation time τ becomes distant from the flexural vibration frequency f. In addition, it is preferable that a value f/fm obtained by dividing the flexural vibration frequency by the relaxation vibration frequency fm exceed 0.09, which suppresses a reduction in the Q value due to the thermoelastic effect. More preferably, 0.25<f/fm is satisfied, and further preferably, 1<f/fm is satisfied. Accordingly, further improvement of the Q value is achieved.

Modified Example 1

Figure 6B:
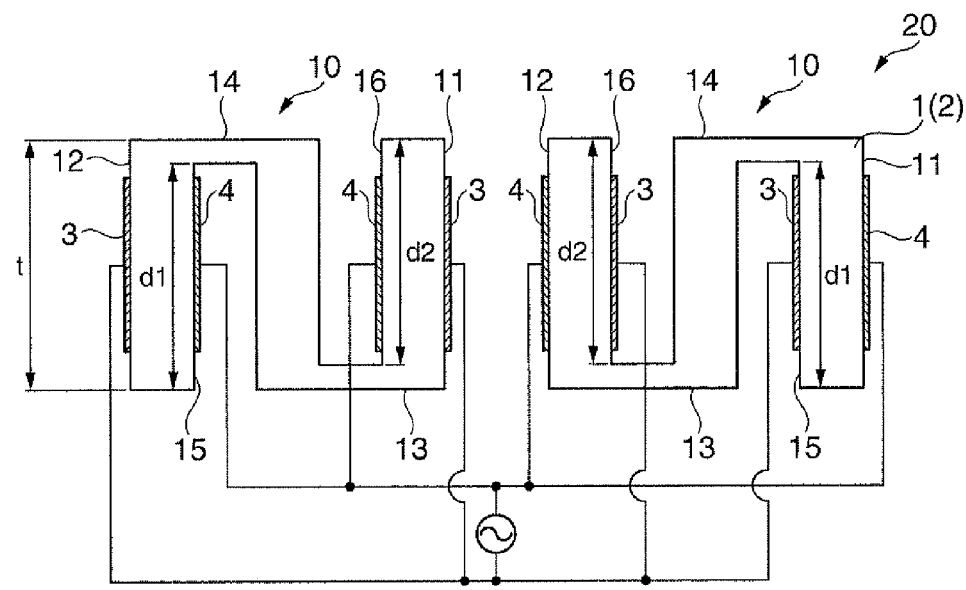

FIG. 6(b) illustrates a modified example of the second embodiment related to the first and second grooves and 16 illustrated in FIG. 6(a). FIG. 6(b) is different from FIG. 6(a) in the arrangement of the first and second grooves 15 and 16 of the other flexural vibrating portion 1 illustrated on the right in FIG. 6(b). That is, the first groove 15 provided in the third surface 13 which is the first principal surface is disposed to oppose the first surface 11, and the second groove 16 provided in the fourth surface 14 which is the second principal surface is disposed to oppose the second surface 12.

The arrangement and wiring of the one flexural vibrating portion 1, the base 2, and the two pairs of the excitation electrodes 3 and 4 illustrated on the left are as illustrated in FIG. 6(a). In addition, as in FIG. 6(a), an alternating current flows between the excitation electrodes 3 and 4. Accordingly, in the flexural vibrating portion 1, flexural vibration indicated by the solid arrow and the double-dot-dashed arrow in FIG. 5 occurs.

As such, in the first and second surfaces 11 and 12 which alternately expand and contract due to the flexural vibration, the heat transfer path for temperature equilibrium from the temperature difference between the first and second surfaces 11 and 12 by the thermal conduction (heat transfer) is made to detour to the first and second grooves 15 and 16 and thus becomes longer than the straight-line distance between the first and second surfaces 11 and 12. Accordingly, the relaxation time τ for temperature equilibrium by the thermal conduction (heat transfer) is lengthened, so that the relaxation vibration frequency fo which is in inverse proportion to the relaxation time τ becomes distant from the flexural vibration frequency f. In addition, it is preferable that a value f/fm obtained by dividing the flexural vibration frequency f by the relaxation vibration frequency fm exceed 0.09, which suppresses a reduction in the Q value due to the thermoelastic effect. More preferably, 0.25<f/fm is satisfied, and further preferably, 1<f/fm is satisfied. Accordingly, further improvement of the Q value is achieved.

Modified Example 2

FIG. 7 is a diagram illustrating a modified example of the second embodiment related to the arrangement of the excitation electrodes 3 and 4 illustrated in FIG. 6(a).

FIG. 7 is different from FIG. 6(a) in that one pair of excitation electrodes 3 and 4 is provided in each of the two sets of the flexural vibrating portions 1 and the bases 2.

Figure 7A:
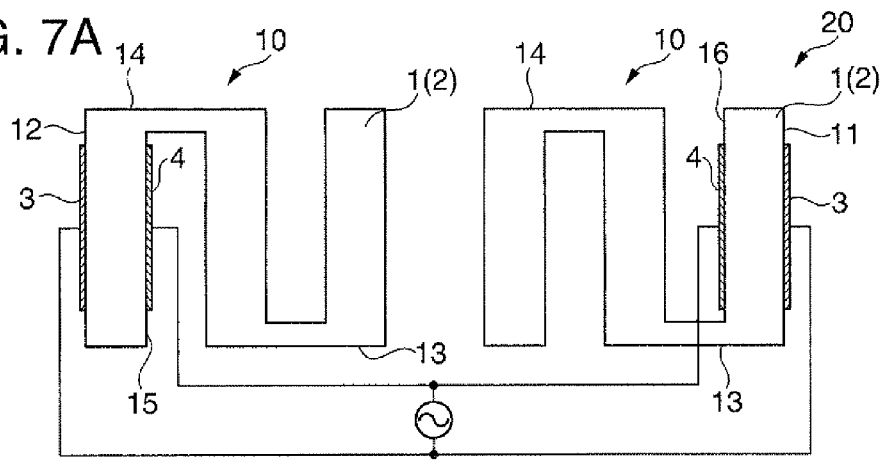
FIG. 7 is a Z-X schematic cross-sectional view as seen from the Y(+) direction of FIG. 5, and is a schematic wiring diagram.

As illustrated in FIG. 7(a), the excitation electrodes 3 are disposed on the second surface 12 of the one flexural vibrating portion 1 illustrated on the left and on the first surface 11 of the other flexural vibrating portion 1 illustrated on the right. In addition, the excitation electrodes 4 are disposed in the first groove 15 of the one flexural vibrating portion 1 illustrated on the left and in the second groove 16 of the other flexural vibrating portion 1 illustrated on the right.

Figure 7B:
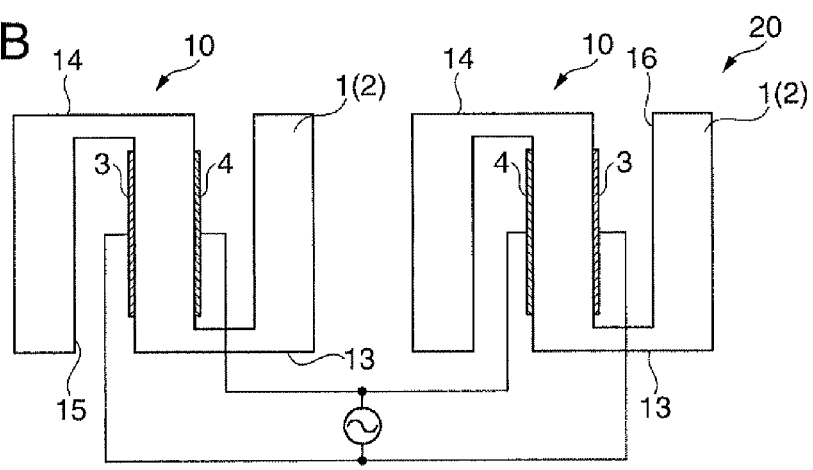

As illustrated in FIG. 7(b), the excitation electrodes 3 are disposed in the first groove 15 of the one flexural vibrating portion 1 illustrated on the left and in the second groove 16 of the other flexural vibrating portion 1 illustrated on the right. In addition, the excitation electrodes 4 are disposed in the second groove 16 of the one flexural vibrating portion 1 illustrated on the left and in the first groove 15 of the other flexural vibrating portion 1 illustrated on the right.

Figure 7C:
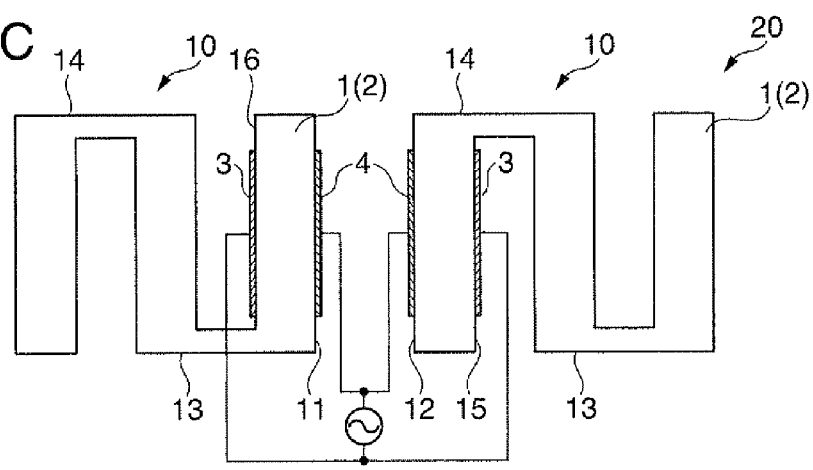

As illustrated in FIG. 7(c), the excitation electrodes 3 are disposed in the second groove 16 of the one flexural vibrating portion 1 illustrated on the left and in the first groove 15 of the other flexural vibrating portion 1 illustrated on the right. In addition, the excitation electrodes 4 are disposed on the first surface 11 of the one flexural vibrating portion 1 illustrated on the left and on the second surface 12 of the other flexural vibrating portion 1 illustrated on the right.

The wiring of the excitation electrodes 3 and 4 is the same as that of FIG. 6(a). In addition, an alternating current flows between the excitation electrodes 3 and 4. Accordingly, in the flexural vibrating portion 1, flexural vibration indicated by the solid arrow and the double-dot-dashed arrow in FIG. 5 occurs.

Here, in FIG. 7, the arrangement of the two sets of the flexural vibrating portions 1 and the bases 2 is illustrated as that in FIG. 6(a), however, may be disposed in the same arrangement as that of the two sets of the flexural vibrating portions 1 and the bases 2 illustrated in FIG. 6(b).

As such, in the first and second surfaces 11 and 12 which alternately expand and contract due to the flexural vibration, the heat transfer path for temperature equilibrium from the temperature difference between the first and second surfaces 11 and 12 by the thermal conduction (heat transfer) is made to detour to the first and second grooves 15 and 16 and thus becomes longer than the straight-line distance between the first and second surfaces 11 and 12. Accordingly, the relaxation time t for temperature equilibrium by the thermal conduction (heat transfer) is lengthened, so that the relaxation vibration frequency fo which is in inverse proportion to the relaxation time τ becomes distant from the flexural vibration frequency f. In addition, it is preferable that a value f/fm obtained by dividing the flexural vibration frequency f by the relaxation vibration frequency fm exceed 0.09, which suppresses a reduction in the Q value due to the thermoelastic effect. More preferably, 0.25<f/fm is satisfied, and further preferably, 1<f/fm is satisfied. Accordingly, further improvement of the Q value is achieved.

Modified Example 3

FIG. 8 is a diagram illustrating a modified example of the second embodiment related to the arrangement of the excitation electrodes 3 and 4 and the shapes of the flexural vibrating portion 1 and the base 2 illustrated in FIGS. 6 and 7.

Figure 8A:
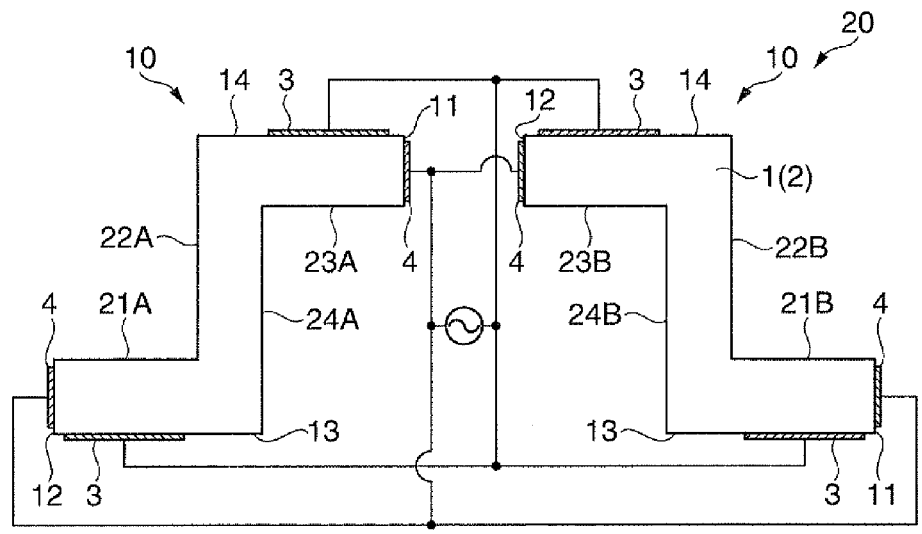
FIG. 8 is a diagram showing a modified example of the second embodiment.
Figure 8B:
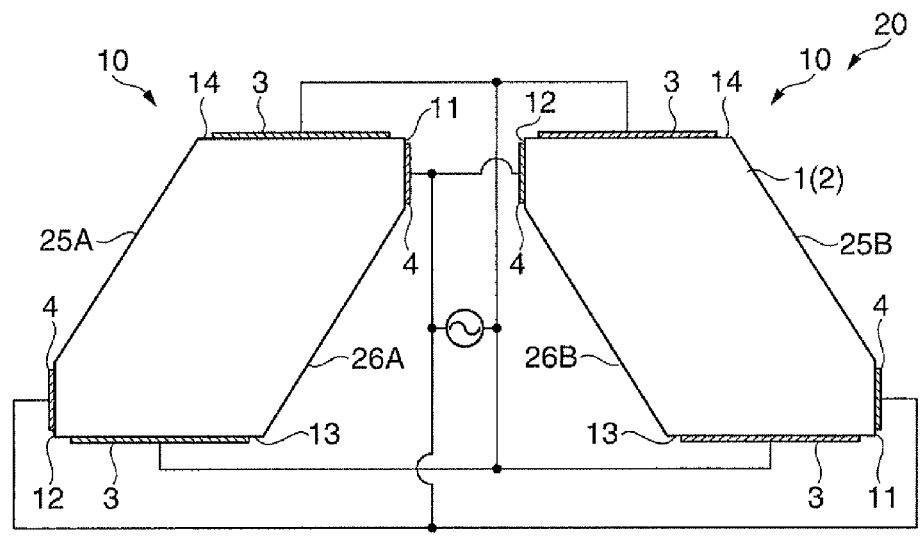

As illustrated in FIGS. 8(a) and 8(b), the excitation electrodes 3 are disposed on the third and fourth surfaces 13 and 14 of the flexural vibrating portion 1. In addition, the excitation electrodes 4 are disposed on the first and second surfaces 11 and 12 of the flexural vibrating portion 1. In addition, the surface including the first surface 11 and the surface including the second surface 12 are mutually opposed. The surface including the third surface 13 and the surface including the fourth surface 14 are mutually opposed.

The surface including the first surface 11 indicated here represents the first surface 11 and a surface in which the first surface 11 extends and which intersects a surface in which the third surface 13 extends. Conversely, the surface including the third surface 13 represents the third surface 13 and a surface in which the third surface 13 extends and which intersects a surface in which the first surface 11 extends. In addition, the surface including the second surface 12 represents the second surface 12 and a surface in which the second surface 12 extends and which intersects a surface in which the fourth surface 14 extends. Conversely, the surface including the fourth surface 14 represents the fourth surface 14 and a surface in which the fourth surface 14 extends and which intersects a surface in which the second surface 12 extends.

As illustrated in FIG. 8(a), the one flexural vibrating portion 1 and the base 2 illustrated on the left are provided with surfaces 21A and 22A in the fourth surface 14 as the second groove 16, and provided with surfaces 23A and 24A in the third surface 13 as the first groove 15. In addition, the other flexural vibrating portion 1 and the base 2 illustrated on the right are provided with surfaces 23B and 24B in the third surface 13 as the first groove 15, and are provided with surfaces 21B and 22B in the fourth surface 14 as the second groove 16.

As such, in the first and second surfaces 11 and 12 which alternately expand and contract due to the flexural vibration, the heat transfer path for temperature equilibrium from the temperature difference between the first and second surfaces 11 and 12 by the thermal conduction (heat transfer) is made to detour between the surfaces 22A and 24A and between the surfaces 22B and 24B and thus becomes longer than the straight-line distance between the surface including the first surface 11 and the surface including the second surface 12. Accordingly, the relaxation time τ for temperature equilibrium by the thermal conduction (heat transfer) is lengthened, so that the relaxation vibration frequency fo which is in inverse proportion to the relaxation time τ becomes distant from the flexural vibration frequency f. In addition, it is preferable that a value f/fm obtained by dividing the flexural vibration frequency f by the relaxation vibration frequency fm exceed 0.09, which suppresses a reduction in the Q value due to the thermoelastic effect. More preferably, 0.25<f/fm is satisfied, and further preferably, 1<f/fm is satisfied. Accordingly, further improvement of the Q value is achieved.

As illustrated in FIG. 8(b), the one flexural vibrating portion 1 and the base 2 illustrated on the left are provided with a surface 25A in the fourth surface 14 as the second groove 16, and provided with a surface 26A in the third surface 13 as the first groove 15.

In addition, the other flexural vibrating portion 1 and the base 2 illustrated on the right are provided with a surface 26B in the third surface 13 as the first groove 15, and are provided with a surface 25B in the fourth surface 14 as the second groove 16.

As such, in the first and second surfaces 11 and 12 which alternately expand and contract due to the flexural vibration, in the heat transfer path for temperature equilibrium from the temperature difference between the first and second surfaces 11 and 12 by the thermal conduction (heat transfer), the shortest distance (the shortest distance connecting the first and second surfaces 11 and 12) between the first and second surfaces and 12 is made longer than a straight-line distance between the surface including the first surface 11 and the surface including the second surface 12. Accordingly, the relaxation time τ for temperature equilibrium by the thermal conduction (heat transfer) is lengthened, so that the relaxation vibration frequency fo which is in inverse proportion to the relaxation time becomes distant from the flexural vibration frequency f. In addition, it is preferable that a value f/fm obtained by dividing the flexural vibration frequency f by the relaxation vibration frequency fm exceed 0.09, which suppresses a reduction in the Q value due to the thermoelastic effect. More preferably, 0.25<f/fm is satisfied, and further preferably, 1<f/fm is satisfied. Accordingly, further improvement of the Q value is achieved.

As such, even in Modified Example 3, the heat transfer path between the first and second surfaces 11 and 12 is made longer than the shortest distance between the surface including the first surface 11 and the surface including the second surface 12. The shortest distance is a shortest distance between the surface in which the first surface 11 extends and the surface in which the second surface 12 extends.

In Modified Example 3, as illustrated in FIGS. 6 and 7, it is more preferable that the third and fourth surfaces 13 and 14 be provided with the first and second grooves 15 and 16, respectively.

Modified Example 4

FIG. 9 is a diagram illustrating a modified example of the second embodiment related to the shapes of the first and second grooves 15 and 16 of the flexural vibrating reed 20 illustrated in FIG. 6.

Figure 9A:
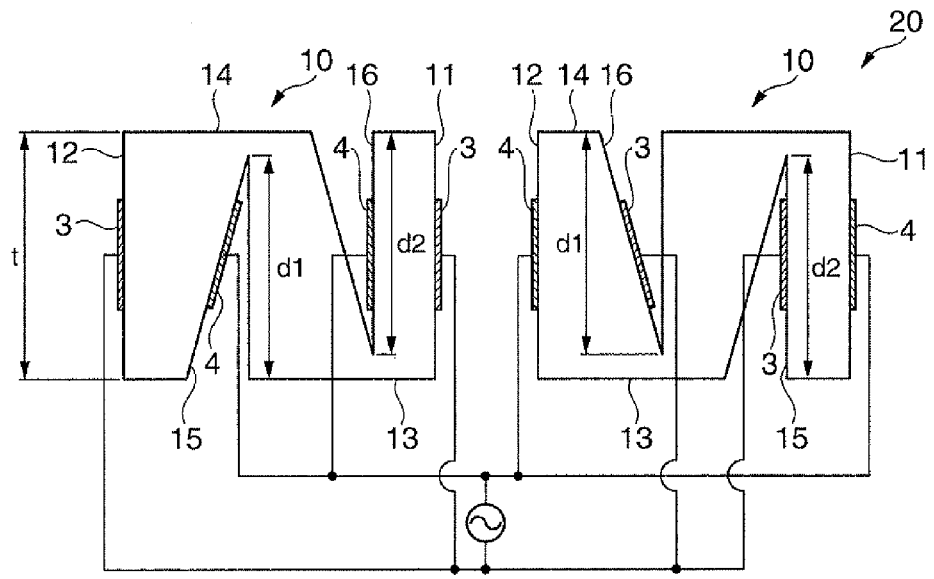
FIG. 9 is a diagram showing a modified example of the second embodiment.
Figure 9B:
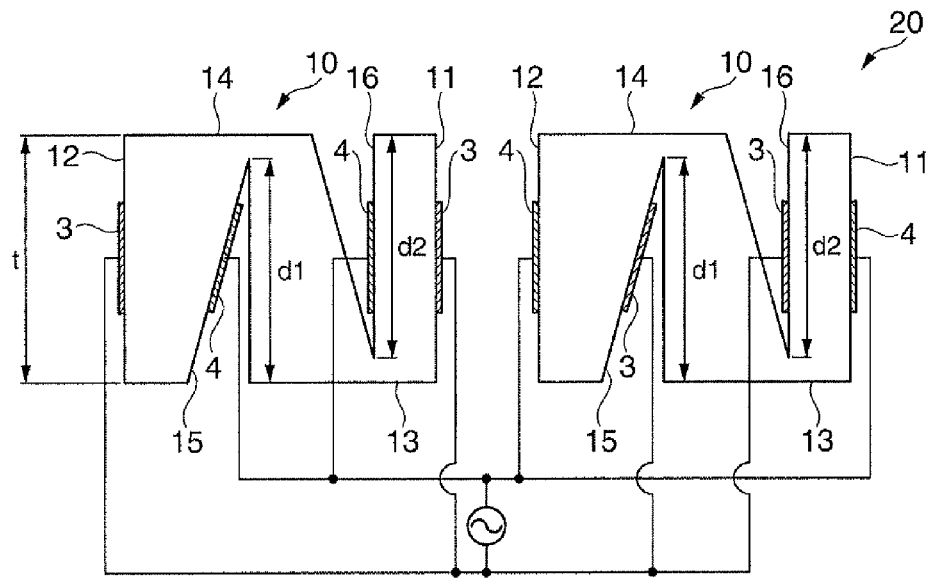

The first and second grooves 15 and 16 illustrated in FIGS. 9(a) and 9(b) are formed in triangular shapes other than the rectangular shapes in FIGS. 6(a) and 6(b). Here, the difference between FIGS. 9(a) and 9(b) is the same as the difference between FIGS. 6(a) and 6(b) in the arrangement of the first and second grooves 15 and 16 of the other flexural vibrating portion 1 illustrated on the right.

Modified Example 5

FIG. 10 is a diagram illustrating a modified example of the second embodiment related to the shapes of the base 2 and the connection portion 29 and the arrangement of the fixed electrodes 5 and 6 illustrated in FIG. 5.

Figure 10A:
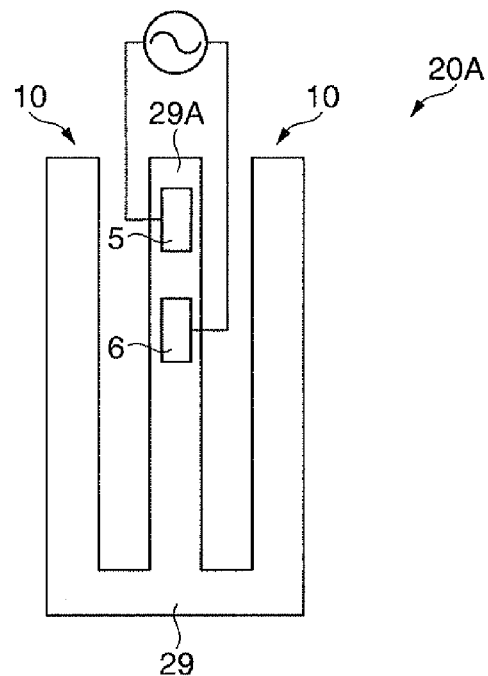
FIG. 10 is a diagram showing a modified example of the second embodiment.

In a crystal vibrating reed 20A illustrated in FIG. 10(a), a fixed portion 29A formed to extend from the connection portion 29 illustrated in FIG. 5 is interposed between the two flexural vibrating reeds 10.

Figure 10B:
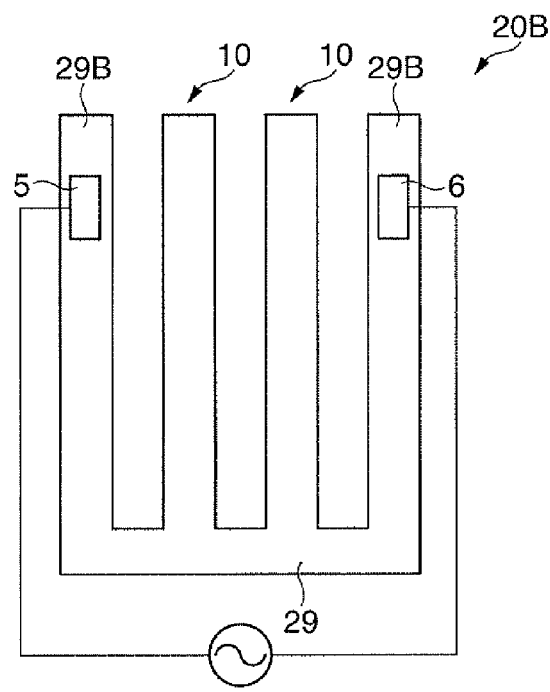

In a crystal vibrating reed 20B illustrated in FIG. 10(b), two fixed portions 29B formed to extend from the connection portion 29 illustrated in FIG. 5 are provided, and the two crystal vibrating reeds 10 are interposed between the two fixed portions 29B so as to be connected.

According to the second embodiment and Modified Examples 1 and 2, the crystal vibrating reed 20 is described using the flexural vibrating portion 1 and the base 2 illustrated in FIG. 3(a). However, the invention is not limited thereto, and the crystal vibrating reed 20 using the flexural vibrating portion 1 and the base 2 illustrated in FIG. 3(b) or 3(c) may be employed.

Therefore, according to the second embodiment and Modified Examples 1 to 5, the same effects as those of the above-described embodiment are exhibited. In addition, in Modified Example 3, the heat transfer path between the first and second surfaces 11 and 12 is made longer than the straight-line distance between the surface including the first surface 11 and the surface including the second surface 12. Accordingly, the same effects as those of the above-described embodiment are exhibited.

Third Embodiment

Hereinafter, a third embodiment will be described with reference to FIGS. 11 and 12.

Figure 11:
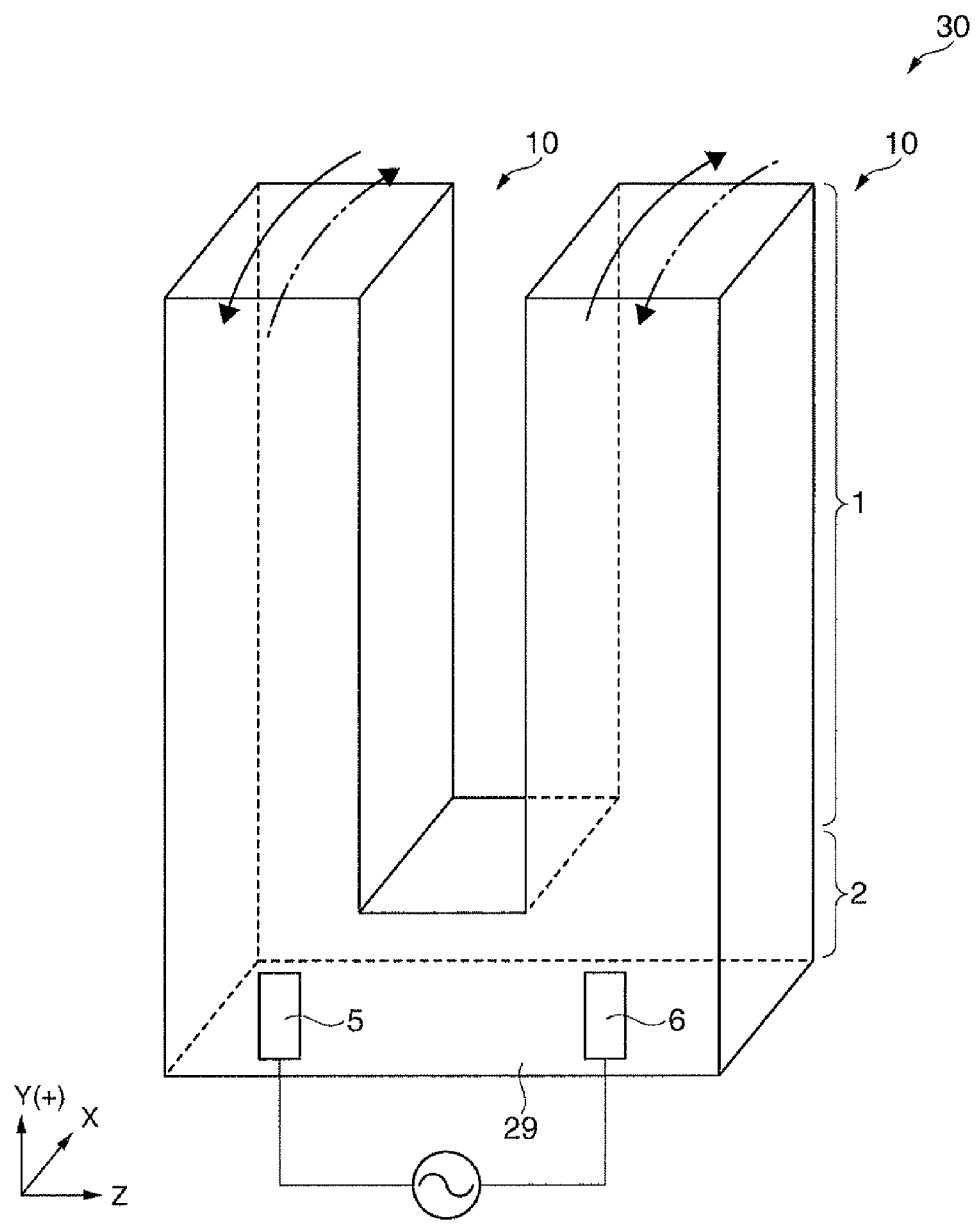
FIG. 11 is a schematic perspective view illustrating a crystal vibrating reed according to a third embodiment.

FIG. 11 is a schematic perspective view illustrating a crystal vibrating reed 30 according to the third embodiment. FIG. 12 is a Z-X schematic cross-sectional view as seen from the Y(+) direction of FIG. 11. Hereinafter, the shapes illustrated in FIG. 3(a) is exemplified for the description of the flexural vibrating portion 1 which is the vibrating portion, the excitation electrodes 3 and 4, and the base 2.

The crystal vibrating reed 30 illustrated in FIG. 11 has the same configuration and wiring as those of the second embodiment illustrated in FIG. 5 and is different therefrom in that the vibrating direction of the flexural vibrating portion 1 which is the vibrating portion is different as indicated by the solid arrows and the double-dot-dashed arrows. Accordingly, like elements are denoted by like reference numerals, description of the configuration and wiring is omitted, and the difference in the vibrating direction will be described.

Figure 12A:
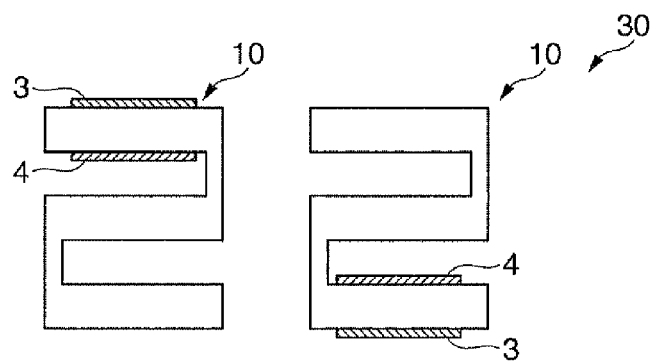
FIG. 12 is a Z-X schematic cross-sectional view as seen from the Y(+) direction of FIG. 11.

FIG. 12(a) shows an arrangement in which the two sets of the flexural vibrating portions 1, the excitation electrodes 3 and 4, and the bases 2 illustrated in FIG. 7(a) are rotated clockwise by 90°. Otherwise, an arrangement is shown in which the two flexural vibrating portions 1, the excitation electrodes 3 and 4, and the bases 2 illustrated in FIG. 7(c) are rotated counterclockwise by 90°.

Figure 12B:
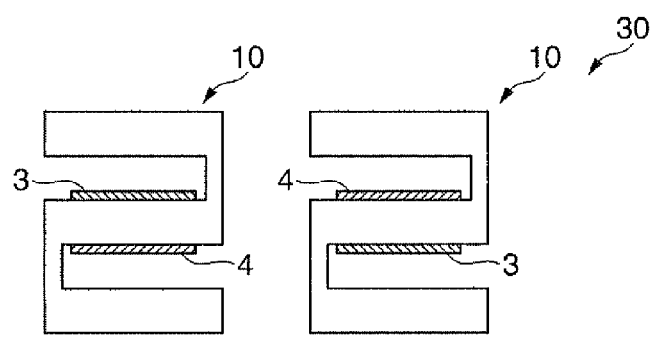

FIG. 12(b) shows an arrangement in which the two sets of the flexural vibrating portions 1, the excitation electrodes 3 and 4, and the bases 2 illustrated in FIG. 7(b) are rotated counterclockwise by 90°. Otherwise, an arrangement is shown in which the two flexural vibrating portions 1, the excitation electrodes 3 and 4, and the bases 2 illustrated in FIG. 7(b) are rotated clockwise by 90°.

Figure 12C:
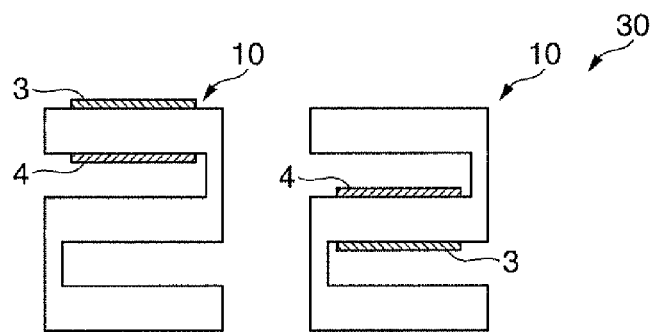

FIG. 12(c) shows an arrangement including the one flexural vibrating portion 1, the excitation electrodes 3 and 4, and the base 2 illustrated on the left in FIG. 12(a) and the other flexural vibrating portion 1, the excitation electrodes 3 and 4, and the base 2 illustrated on the right in FIG. 12(b).

Figure 12D:
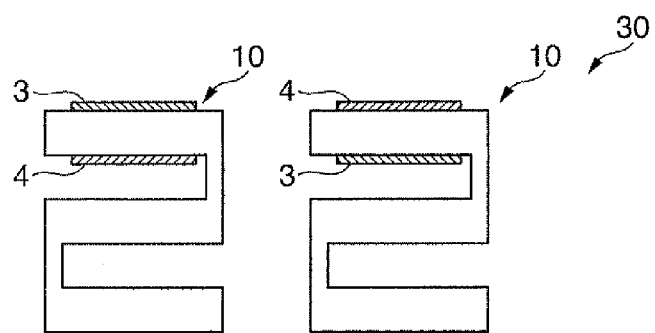

FIG. 12(d) shows an arrangement in which, from among the two sets of the flexural vibrating portion 1, the excitation electrodes 3 and 4, and the bases 2 illustrated in FIG. 7(c), the one flexural vibrating portion 1, the excitation electrodes 3 and 4, and the base 2 illustrated on the left is rotated counterclockwise by 90°, and the other flexural vibrating portion 1, the excitation electrodes 3 and 4, and the base 2 illustrated on the right is rotated clockwise by 90°.

Therefore, according to the third embodiment, the same effects as those of the above-described embodiments can be exhibited.

In the third embodiment, the crystal vibrating reed is described using the flexural vibrating portion 1, the excitation electrodes 3 and 4, and the base 2 illustrated in FIG. 3(a). However, the invention is not limited thereto, and the crystal vibrating reed 30 using the flexural vibrating portion 1, the excitation electrodes 3 and 4, and the base 2 illustrated in FIG. 3(b) or 3(c) may be employed. Otherwise, the crystal vibrating reed 30 using the flexural vibrating portion 1, the excitation electrodes 3 and 4, and the base 2 illustrated in FIGS. 8 and 9 may also be employed.

Fourth Embodiment

Hereinafter, a fourth embodiment will be described with reference to FIGS. 13 and 14.

Figure 13:
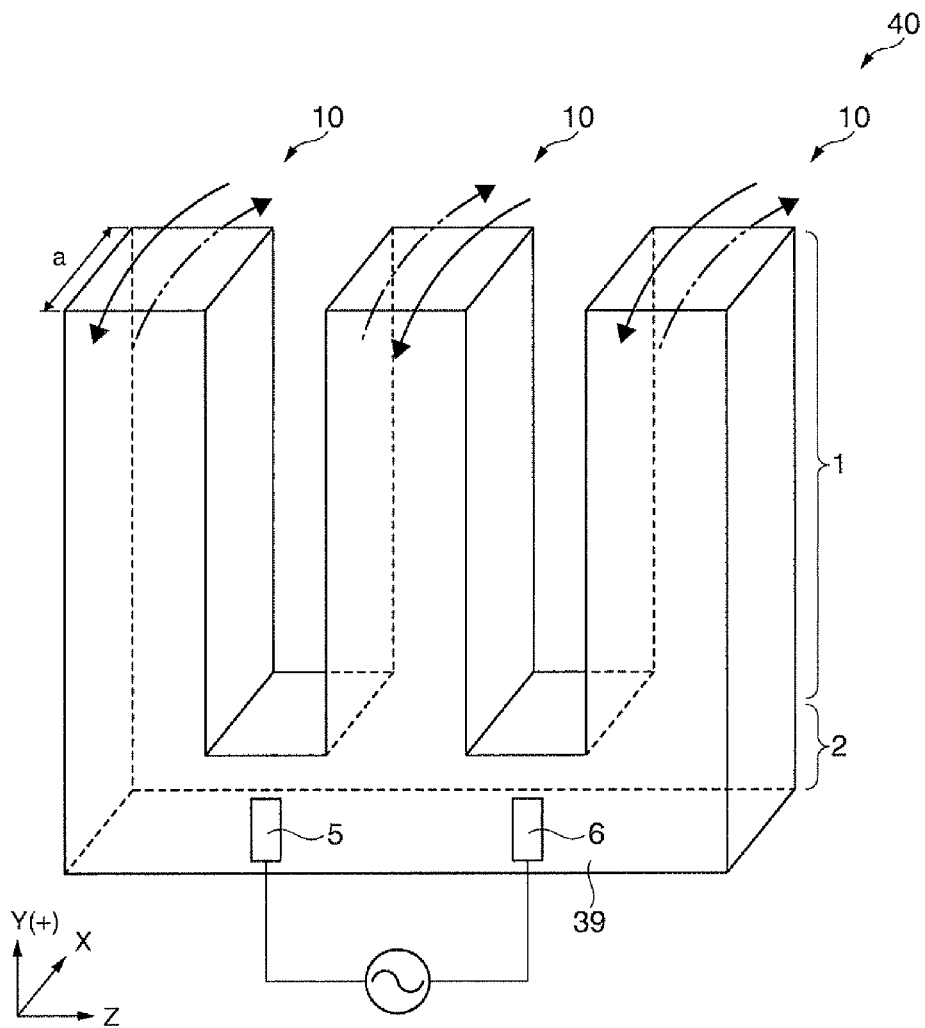
FIG. 13 is a schematic perspective view illustrating a crystal vibrating reed according to a fourth embodiment.

FIG. 13 is a schematic perspective view illustrating a crystal vibrating reed 40 according to a fourth embodiment. FIG. 14 is a Z-X schematic cross-sectional view as seen from the Y(+) direction of FIG. 13, and is a schematic wiring diagram.

The crystal vibrating reed 40 illustrated in FIG. 13 vibrates in the direction indicated by the solid arrows and the double-dot-dashed arrows, similar to the crystal vibrating reed 30 of the third embodiment illustrated in FIG. 11.

The crystal vibrating reed 40 is different from the crystal vibrating reed 30 of the third embodiment in that three sets of the flexural vibrating portions 1 which are the vibrating portions, the excitation electrodes 3 and 4, and the bases 2 are provided. Accordingly, like elements are denoted by like reference numerals, and description of the configuration will be omitted. Hereinafter, the shapes and arrangement illustrated in FIG. 3(a) are exemplified for the description of the flexural vibrating portion 1, the excitation electrodes 3 and 4, and the base 2.

As illustrated in FIG. 13, the crystal vibrating reed 40 includes three sets of the flexural vibrating portions 1 and the bases 2 illustrated in FIG. 1. In addition, the neighboring bases 2 are joined by the corresponding connection portions 39.

Figure 14A:
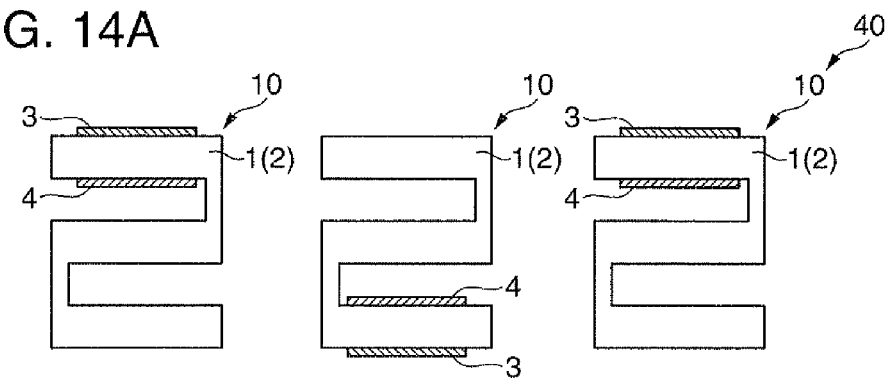
FIG. 14 is a Z-X schematic cross-sectional view as seen from the Y(+) direction of FIG. 13, and is a schematic wiring diagram.

FIG. 14(a) shows an arrangement including the flexural vibrating portions 1, the excitation electrodes 3 and 4, and the bases 2 of the arrangement illustrated in FIG. 12(a) and on the right, including the one flexural vibrating portion 1, the excitation electrodes 3 and 4, and the base 2 illustrated on the left of FIG. 12(a).

Figure 14B:
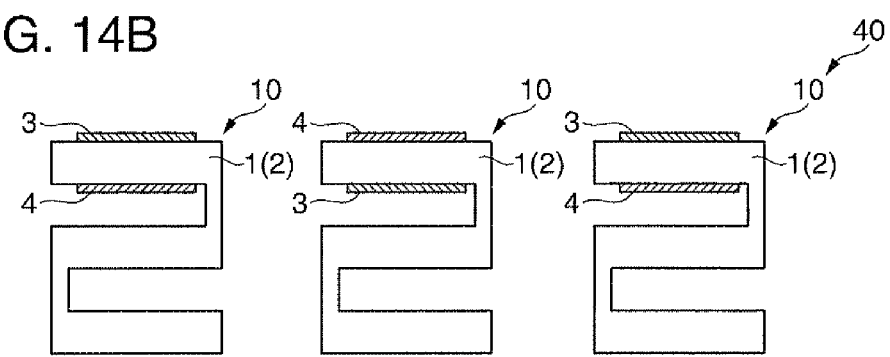

FIG. 14(b) shows an arrangement including three sets of the flexural vibrating portions 1, the excitation electrodes 3 and 4, and the bases 2 of the arrangement illustrated in FIG. 12(d).

Figure 14C:
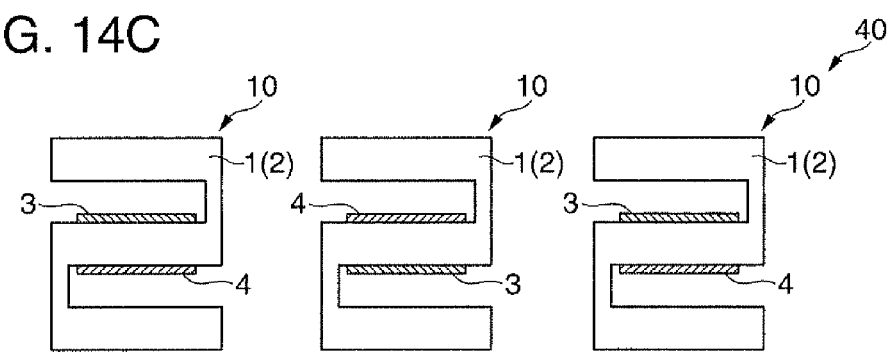

FIG. 14(c) shows an arrangement including three sets of the flexural vibrating portions 1, the excitation electrodes 3 and 4, and the bases 2 of the arrangement illustrated in FIG. 12(b).

FIG. 15 is a diagram showing a modified example of the fourth embodiment related to the arrangement of the flexural vibrating portions 1 and the bases 2 illustrated in FIG. 14.

Modified Example

Figure 15A:
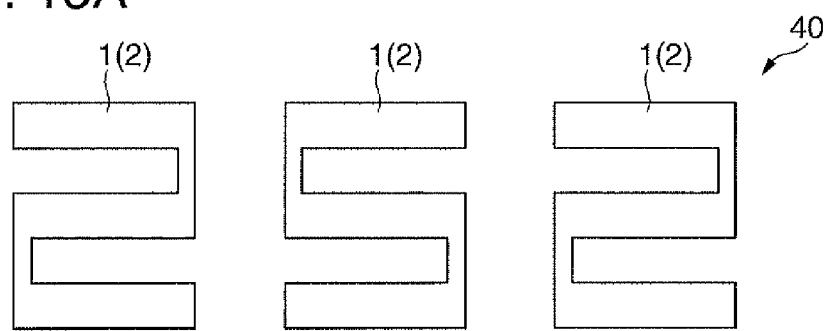
FIG. 15 is a diagram showing a modified example of the fourth embodiment.

The crystal vibrating reed 40 illustrated in FIG. 15(a) has an arrangement in which, from among the three sets of the flexural vibrating portions 1 and the bases 2 of the arrangement illustrated in FIG. 14(a), the flexural vibrating portion 1 and the base 2 at the center is rotated by 180°.

Figure 15B:
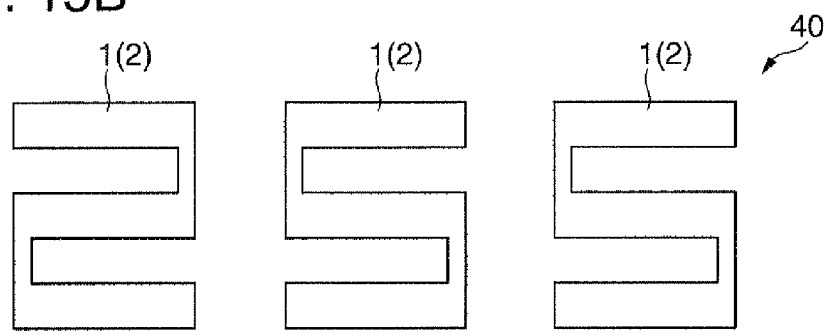

The crystal vibrating reed 40 illustrated in FIG. 15(b) has an arrangement in which, from among the three sets of the flexural vibrating portions 1 and the bases 2 of the arrangement illustrated in FIG. 14(a), the flexural vibrating portions 1 and the bases 2 at the center and on the right are each rotated by 180°.

In the crystal vibrating reed 40 illustrated in FIGS. 15(a) and 15(b), the illustration of the excitation electrodes 3 and 4 is omitted. However, the excitation electrodes 3 and 4 illustrated in FIGS. 14(a) to 14(c) are disposed.

In the fourth embodiment, the crystal vibrating reed is described using the flexural vibrating portion 1 and the base 2 illustrated in FIG. 3(a). However, the invention is not limited thereto, and the crystal vibrating reed 40 using the flexural vibrating portion 1 or the base 2 illustrated in FIG. 3(b) or FIG. 3(c) may also be employed.

Therefore, according to the fourth embodiment, the same effects as those of the above-described embodiment are exhibited.

Fifth Embodiment

Hereinafter, a crystal vibrator is exemplified as a piezoelectric vibrator according to a fifth embodiment fort the description.

The piezoelectric vibrator according to the fifth embodiment is the crystal vibrator using the piezoelectric vibrating reed according to the first to fourth embodiments. Accordingly, the piezoelectric vibrating reed used for the piezoelectric vibrator according to the fifth embodiment has the same configuration as the piezoelectric vibrating reeds according to the first to fourth embodiments, so that like elements are denoted by like reference numerals and description of the configuration will be omitted. Hereinafter, the crystal vibrating reed 20 according to the second embodiment is exemplified for the description.

Figure 16:
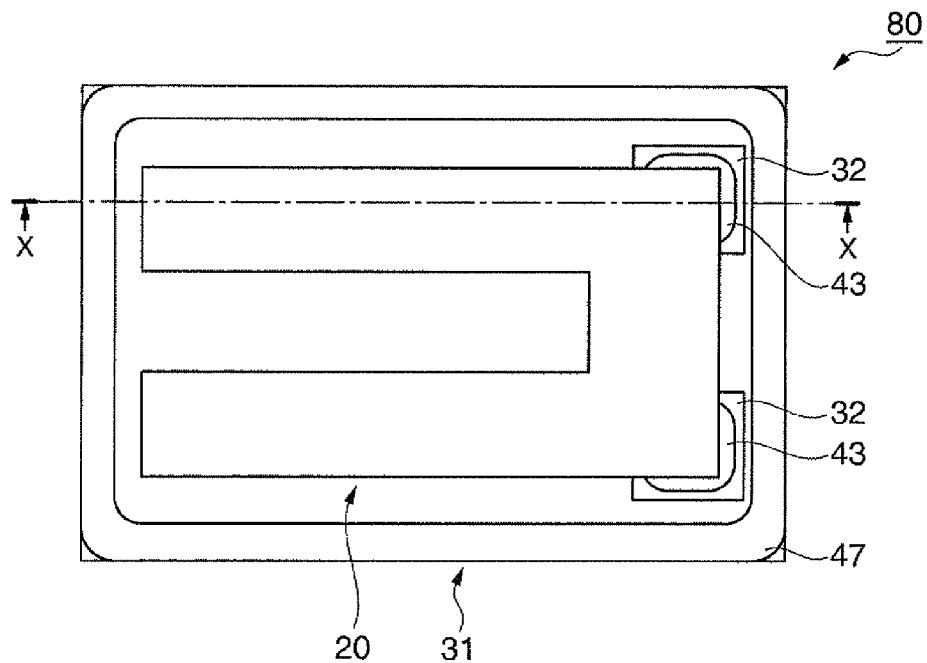
FIG. 16 is a schematic plan view of a crystal vibrator of which the internal structure is exposed by removing a cover member according to a fifth embodiment.
Figure 17:
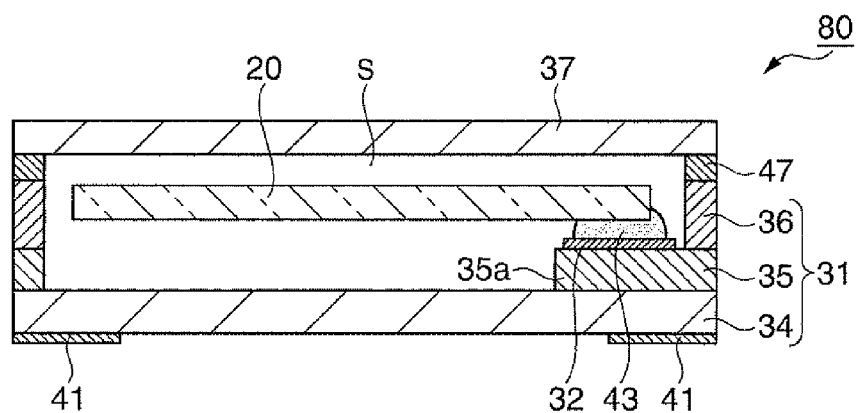
FIG. 17 is a schematic cross-sectional view taken along the line X-X of FIG. 16.

FIG. 16 is a schematic plan view of a crystal vibrator of which the internal structure is exposed by removing a cover member. FIG. 17 is a schematic cross-sectional view taken along the line X-X of FIG. 16 and illustrates the cover member disposed.

As illustrated in FIGS. 16 and 17, in the crystal vibrator 80, the crystal vibrating reed 20 is accommodated in a package 31. Specifically, in the crystal vibrator 80, as illustrated in FIG. 17, the crystal vibrating reed 20 is accommodated in the package 31 including a first substrate 34, a second substrate 35 stacked on the first substrate 34, and a third substrate 36.

The package 31 includes the first, second, and third substrates 34, 35, and 36 which are insulating substrates. The second substrate 35 includes an extending portion 35*a* extending in the package 31. The extending portion 35*a* is provided with two electrode portions 32. The fixed electrodes 5 and 6 of the crystal vibrating reed 20 are fixed to the electrode portions 32 using a conductive paste or the like for electrical connection. Here, as a conductive adhesive 43, those obtained by adding conductive particles such as silver particles to a binder component made of a predetermined synthetic resin may be used.

The first, second, and third substrates 34, 35, and 36 may be formed of insulating materials, and ceramics is suitable. Particularly, as a preferable material, those having the same or extremely similar thermal expansion coefficient to the thermal expansion coefficient of the crystal vibrating reed 20 or the cover member 37 are selected, and in this embodiment, for example, a ceramic green sheet is used. The green sheet is obtained by, for example, molding a kneaded material generated by dispersing ceramic powder into a predetermined solution and adding a binder thereto, into a sheet-like long tape shape, and cutting this into predetermined lengths.

The first, second, and third substrates 34, 35, and 36 may be formed by stacking the green sheets molded into the illustrated shapes and sintering them. In this case, the first substrate 34 is a substrate constituting the bottom portion of the package 31, and the second and third substrates 35 and 36 overlapped thereon are formed by removing the internal materials of the above-mentioned green sheet having a plate shape into a frame shape so as to form an internal space S of FIG. 17. Using the internal space S, the crystal vibrating reed 20 is accommodated. In the package 31, the cover member 37 formed of ceramic, glass, or metal such as Kovar is bonded via a bonding material such as a Kovar ring, a sealing material 47, or the like. Accordingly, the package 31 is airtightly sealed.

On the first substrate 34, a needed conductive pattern is formed using a conductive paste such as silver or palladium, a conductive paste such as a tungsten metalized material, or the like, the first, second, and third substrates 34, 35, and 36 are then sintered, and nickel, gold, silver, and the like are sequentially plated, thereby forming the above-mentioned electrode portions 32.

As illustrated in FIG. 17, the electrode portions 32 are connected to at least two mount terminals 41 exposed from the bottom portion of the package 31 by a conductive pattern (not shown). The conductive pattern for connecting the electrode portions 32 to the mount terminals 41, is formed on the surface of castellation (not shown) used for forming the package 31 to be put around the outer surface of the package 31 or may be connected via a conductive through-hole penetrating the first and second substrates 34 and 35.

By applying an alternating voltage between the two mount terminals 41, an alternating current flows between the fixed electrodes 5 and 6 (see FIG. 5). Accordingly, flexural vibration indicated by the solid arrows and the double-dot-dashed arrows in the above embodiments occurs in the crystal vibrating reed 20.

Therefore, according to the fifth embodiment, the crystal vibrator exhibiting the same effects as those of the above-described embodiments can be obtained.

Sixth Embodiment

Hereinafter, a crystal oscillator is exemplified as a piezoelectric device according to a sixth embodiment for the description.

The crystal oscillator according to the sixth embodiment is a crystal oscillator using the piezoelectric vibrating reeds according to the first to fourth embodiments. Accordingly, the piezoelectric vibrating reed used for the crystal oscillator according to the sixth embodiment has the same configuration as those of the piezoelectric vibrating reeds according to the first to fourth embodiments, so that like elements are denoted by like reference numerals, and description of the configuration will be omitted. Hereinafter, the crystal vibrating reed 20 according to the second embodiment is used for the description. In addition, the sixth embodiment is different from the fifth embodiment in that the crystal oscillator according to the sixth embodiment includes, in addition to the crystal vibrator described in the fifth embodiment, an IC chip having a driving circuit for driving the crystal vibrator.

Figure 18:
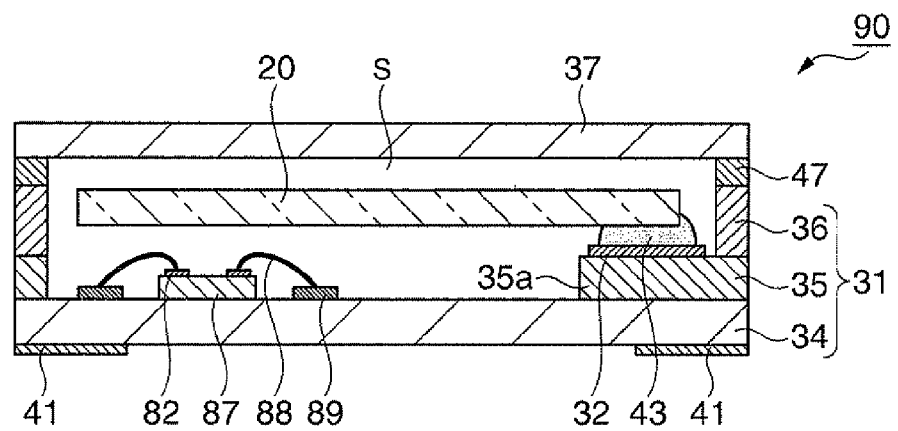
FIG. 18 is a schematic cross-sectional view illustrating a crystal oscillator according to a sixth embodiment.

As illustrated in FIG. 18, on the upper surface of the first substrate 34 which forms the package 31, an internal connection terminal 89 made of gold (Au) is formed. An IC chip 87 is fixed to the upper surface of the first substrate 34 which forms the package 31 using an adhesive or the like. In addition, an IC connection pad 82 made of Au or the like is formed on the upper surface of the IC chip 87. The IC connection pad 82 is connected to the internal connection terminal 89 by a metallic wire 88. In addition, the internal connection terminal 89 is connected to the mount terminal 41 formed on the lower surface of the first substrate 34 outside the package 31 via internal wiring. In addition, as a method of connecting the IC chip 87 and the internal connection terminal 89, in addition to the method using the metallic wire 88, a connection method using flip chip mounting may also be used.

Therefore, according to the sixth embodiment, the crystal oscillator exhibiting the same effects as those of the above-described embodiments can be obtained.

In addition, in the sixth embodiment, as the piezoelectric device, the crystal oscillator is exemplified for the description. However, the invention is not limited thereto, and a gyro sensor providing a detection circuit in the IC chip 87 may also be employed.

In addition, modifications, improvements, and the like in the scope that can solve at least a part of the above-described problems are included in the above-described embodiments.

For example, in the above description, the fixed electrodes 5 and 6 are connected to the excitation electrodes 3 and 4, respectively. However, the invention is not limited thereto, and the fixed electrodes 5 and 6 may also be connected to the excitation electrodes 4 and 3, respectively.

In addition, in the Z-X schematic cross-sectional views (FIGS. 3, 6 to 9, 12, 14, and 15), the first and second grooves 15 and 16 are at equal intervals or symmetrical. However, the invention is not limited thereto, and they may be at different intervals and asymmetrical.

The material of the flexural vibrating reed is not limited to the crystal, and may be a piezoelectric element such as lithium tantalite ($LiTaO_3$), lithium tetraborate ($Li_2B_4O_7$), lithium niobate ($LiNbO_3$), lead zirconate titanate (PZT), zinc oxide (ZnO), aluminium nitride (AlN) or a semiconductor such as silicon.

In addition, in the drawings, the first surface 11, the second surface 12, the third surface 13 which is the first principal surface, and the fourth surface 14 which is the second principal surface are illustrated as flat surfaces. However, the invention is not limited thereto, and for example, they may be surfaces formed of two or more flat surfaces or curves, or surfaces having the ridge lines along the flat surfaces or curves.

REFERENCE SIGNS LIST 1 flexural vibrating portion
2 base
3, 4 excitation electrode
5, 6 fixed electrode
10 crystal vibrating reed
11 first surface
12 second surface
13 third surface
14 fourth surface
15 first groove
16 second groove
20A, 20B crystal vibrating reed
29 connection portion
29A, 29B fixed portion
30 crystal vibrating reed
40 crystal vibrating reed
t distance between third and fourth surfaces
d1 first depth of first groove
d2 second depth of second groove
d3, d4, d5, d6 depth

The invention claimed is:

1. A flexural vibrating reed comprising:
a base; and
a vibrating portion extending in an extension direction from the base,
wherein the vibrating portion includes first and second principal surfaces which are mutually opposed, a first groove provided in the first principal surface, and a second groove provided in the second principal surface,
the first and second grooves are spaced apart along a direction orthogonal to the extension direction in a plan view from a normal direction of the first principal surface,
a first depth of the first groove and a second depth of the second groove are smaller than a distance in the normal direction between the first and second principal surfaces, and
the sum of the first and second depths is greater than the distance.

2. The flexural vibrating reed according to claim 1,
wherein the vibrating portion has third and fourth principal surfaces which connect the first and second principal surfaces to each other and are mutually opposed, and the third and fourth principal surfaces have a relationship in which in a case where the third principal surface expands due to flexural vibration of the vibrating portion, the fourth principal surface contracts, and in a case where the third principal surface contracts, the fourth principal surface expands.

3. The flexural vibrating reed according to claim 1, wherein the first and second grooves are formed from the vibrating portion to the base.

4. The flexural vibrating reed according to claim 1, wherein, assuming that a flexural vibration frequency of the vibrating portion is f, the Pi is $\pi$, a thermal conductivity in the vibrating direction of a material used for the vibrating portion is k, a mass density of the material used for the vibrating portion is $\rho$, a thermal capacity of the material used for the vibrating portion is $C_p$, and a width in the vibrating direction of the vibrating portion is a, $0.09 < f/fm$ is satisfied when $fm = \pi k/(2 \rho C_p a^2)$.

5. The flexural vibrating reed according to claim 1, wherein the first and second grooves are disposed on the base side from a half of the length in the extension direction of the flexural vibrating portion from the base.

6. A flexural vibrator using the flexural vibrating reed according to claim 1, comprising:
the flexural vibrating reed; and
a package that accommodates the flexural vibrating reed, wherein the flexural vibrating reed is airtightly sealed in the package.

7. A piezoelectric device using the flexural vibrating reed according to claim 1, comprising:
the flexural vibrating reed;
an IC chip that drives the flexural vibrator; and
a package that accommodates the flexural vibrating reed and the IC chip, wherein the flexural vibrating reed and the IC chip are airtightly sealed in the package.

8. The flexural vibrating reed according to claim 2, wherein, assuming that a flexural vibration frequency of the vibrating portion is f, the Pi is $\pi$, a thermal conductivity in the vibrating direction of a material used for the vibrating portion is k, a mass density of the material used for the vibrating portion is $\rho$, a thermal capacity of the material used for the vibrating portion is $C_p$, and a width in the vibrating direction of the vibrating portion is a, $0.09 < f/fm$ is satisfied when $fm = \pi k/(2 \rho C_p a^2)$.

9. The flexural vibrating reed according to claim 3, wherein, assuming that a flexural vibration frequency of the vibrating portion is f, the Pi is $\pi$, a thermal conductivity in the vibrating direction of a material used for the vibrating portion is k, a mass density of the material used for the vibrating portion is $\rho$, a thermal capacity of the material used for the vibrating portion is $C_p$, and a width in the vibrating direction of the vibrating portion is a, $0.09 < f/fm$ is satisfied when $fm = \pi k/(2 \rho C_p a^2)$.

10. The flexural vibrating reed according to claim 2, wherein the first and second grooves are disposed on the base side from a half of the length in the extension direction of the flexural vibrating portion from the base.

11. The flexural vibrating reed according to claim 3, wherein the first and second grooves are disposed on the base side from a half of the length in the extension direction of the flexural vibrating portion from the base.

* * * * *